US009196817B2

(12) United States Patent
Werne et al.

(10) Patent No.: US 9,196,817 B2
(45) Date of Patent: Nov. 24, 2015

(54) HIGH VOLTAGE SWITCHES HAVING ONE OR MORE FLOATING CONDUCTOR LAYERS

(71) Applicant: Lawrence Livermore National Security, LLC, Livermore, CA (US)

(72) Inventors: Roger W. Werne, San Ramon, CA (US); Stephen Sampayan, Manteca, CA (US); John Richardson Harris, Patterson, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 14/218,816

(22) Filed: Mar. 18, 2014

(65) Prior Publication Data

US 2014/0312741 A1    Oct. 23, 2014

Related U.S. Application Data

(60) Provisional application No. 61/852,128, filed on Mar. 15, 2013, provisional application No. 61/802,042, filed on Mar. 15, 2013.

(51) Int. Cl.
*H01L 41/187* (2006.01)
*H01L 41/107* (2006.01)
*H01L 41/083* (2006.01)

(52) U.S. Cl.
CPC ............ *H01L 41/107* (2013.01); *H01L 41/083* (2013.01)

(58) Field of Classification Search
USPC ............ 218/7, 14, 55, 78, 130; 315/505, 507; 310/339, 359
See application file for complete search history.

(56) References Cited

U.S. PATENT DOCUMENTS

| | | | |
|---|---|---|---|
| 3,476,979 A * | 11/1969 | Stumpe et al. | 361/91.5 |
| 3,950,628 A * | 4/1976 | Hruda | 200/302.1 |
| 5,118,982 A * | 6/1992 | Inoue et al. | 310/366 |
| 5,381,067 A * | 1/1995 | Greenstein et al. | 310/334 |
| 5,811,944 A | 9/1998 | Sampayan et al. | |
| 5,821,705 A | 10/1998 | Caporaso et al. | |
| 5,834,882 A | 11/1998 | Bishop | |
| 6,278,239 B1 | 8/2001 | Caporaso et al. | |
| 8,248,750 B2 * | 8/2012 | Biggs et al. | 361/273 |
| 8,847,466 B2 * | 9/2014 | Wunnicke et al. | 310/330 |
| 2010/0060207 A1 * | 3/2010 | Caporaso et al. | 315/505 |
| 2011/0006642 A1 * | 1/2011 | Baird et al. | 310/339 |
| 2014/0263979 A1 | 9/2014 | Guethlein | |

FOREIGN PATENT DOCUMENTS

WO    2010/129804 A1    11/2010

OTHER PUBLICATIONS

Harris, J.R., et al., "Multilayer High-gradient Insulators," IEEE Transactions on Dielectrics and Electrical Insulation, 14(4):796-802, Nov. 2006.
Mesyats, G., "Pulsed Power," Kluwer Academic / Plenum Publishers, New York, NY, pp. 91-94, 2005.
Pai, S.T., et al., "Introduction to High Power Pulse Technology," Singapore, World Scientific, pp. 153, 1995.
Sampayan, S. et al., "Optically induced surface flashover switching for the dielectric wall accelerator," Proceedings of the Particle Accelerator Conference, 4:2123-2125, May 1995.
Priya, et al., "Multilayered Unipoled Piezoelectric Transformers," Japanese Journal of Applied Physics, vol. 43, No. 6A, pp. 3503-3510 (2006).

* cited by examiner

*Primary Examiner* — Thomas Dougherty
(74) *Attorney, Agent, or Firm* — Perkins Coie LLP

(57) ABSTRACT

This patent document discloses high voltage switches that include one or more electrically floating conductor layers that are isolated from one another in the dielectric medium between the top and bottom switch electrodes. The presence of the one or more electrically floating conductor layers between the top and bottom switch electrodes allow the dielectric medium between the top and bottom switch electrodes to exhibit a higher breakdown voltage than the breakdown voltage when the one or more electrically floating conductor layers are not present between the top and bottom switch electrodes. This increased breakdown voltage in the presence of one or more electrically floating conductor layers in a dielectric medium enables the switch to supply a higher voltage for various high voltage circuits and electric systems.

20 Claims, 22 Drawing Sheets

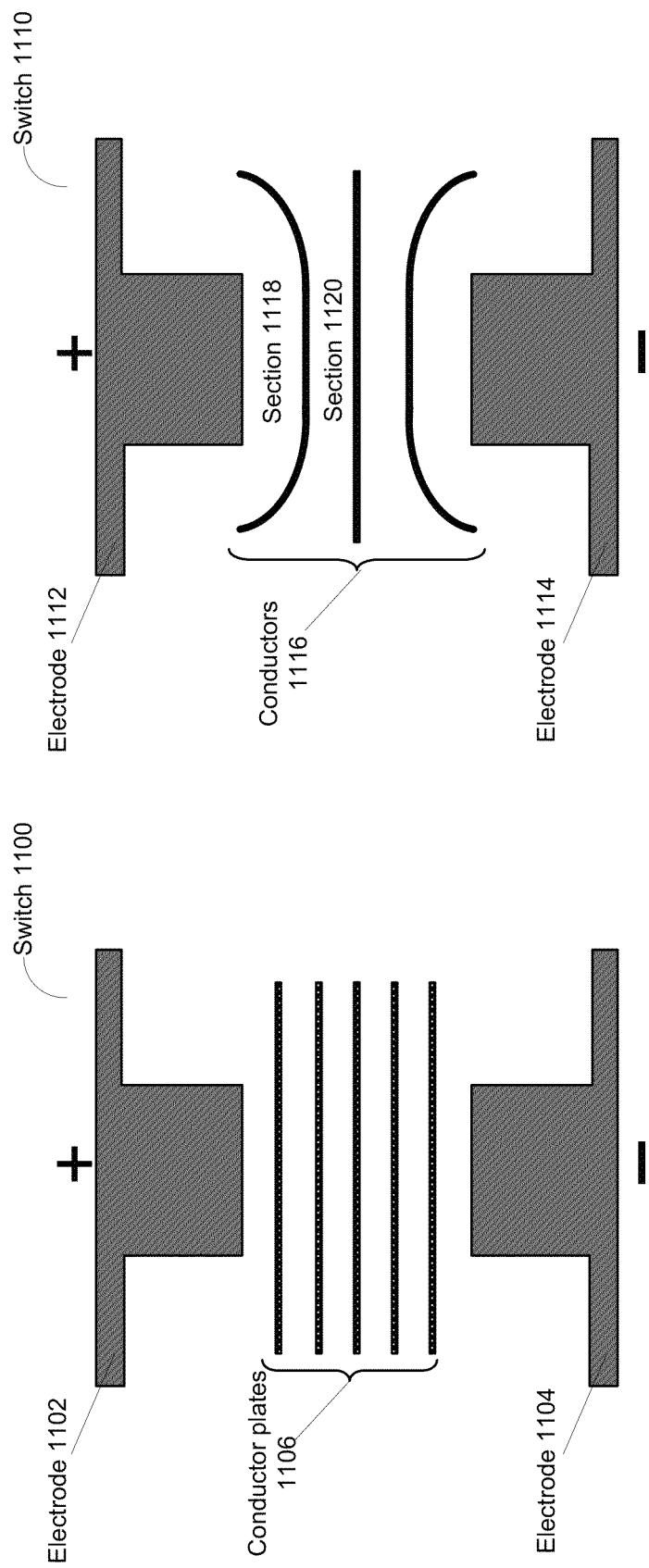

Side    Front

Side    Front

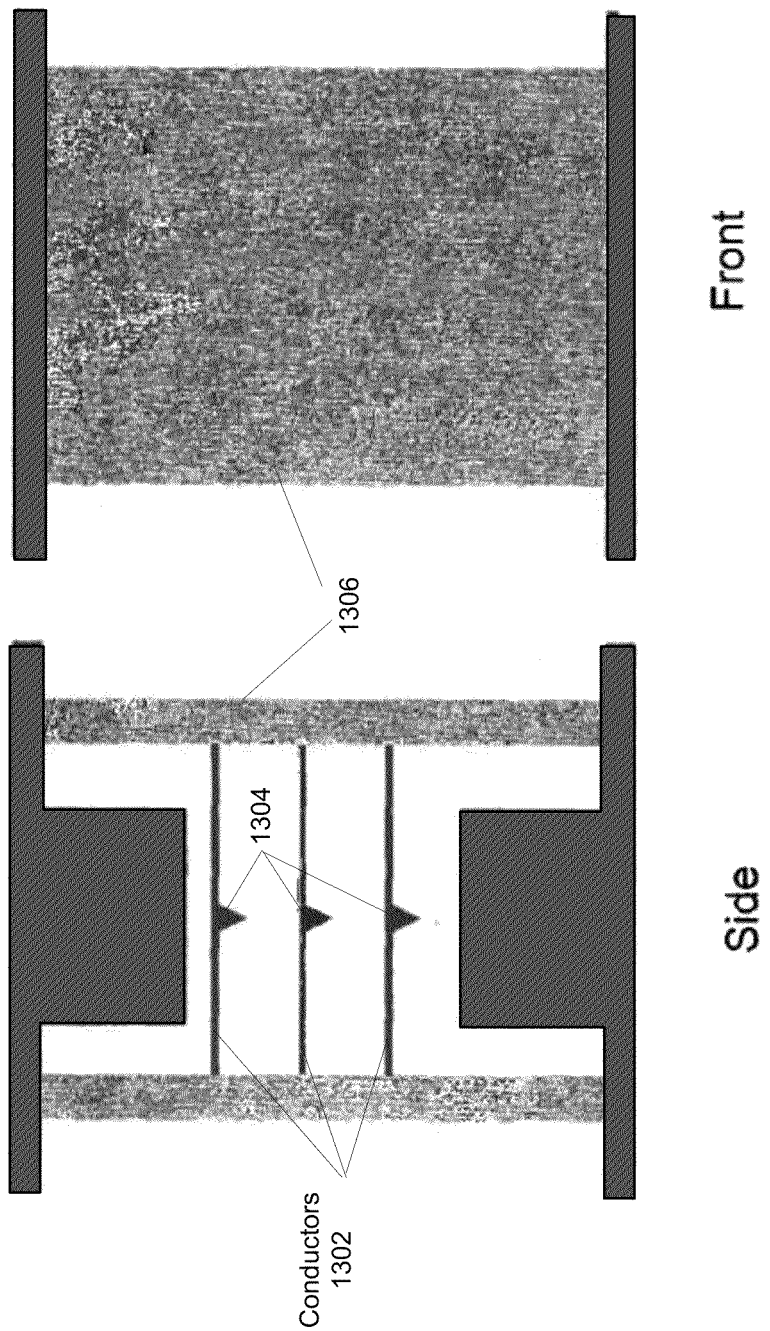

US 9,196,817 B2

HIGH VOLTAGE SWITCHES HAVING ONE OR MORE FLOATING CONDUCTOR LAYERS

CROSS-REFERENCE TO RELATED APPLICATION(S)

This patent document claims the benefit of U.S. Provisional Patent Application No. 61/802,042 filed Mar. 15, 2013, entitled HIGH VOLTAGE SWITCHES HAVING ONE OR MORE FLOATING CONDUCTOR LAYERS, and the benefit of U.S. Provisional Patent Application No. 61/852,128 filed Mar. 15, 2013, entitled STACKABLE HIGH GRADIENT CHARGING SYSTEM. The above two patent applications are incorporated herein by reference in their entirety as part of the disclosure of this patent document.

STATEMENT REGARDING FEDERALLY SPONSORED RESEARCH

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

This patent document relates to high voltage circuits including high voltage switches, high voltage generators and high voltage charging circuits.

BACKGROUND

High voltage switches can be formed by two electrodes separated by a dielectric medium. When the applied voltage across the two electrodes is sufficiently high at or above a threshold voltage to cause a breakdown in the dielectric medium, a conductive path is created by the breakdown of the dielectric medium to create a "on" path and is in the "on" state. When the applied voltage is below the threshold voltage, the switch is in the "off" state.

The operation voltages of high voltage switches, and the output voltages of high voltage generators and charging circuits tend to be limited by the breakdown voltages of the dielectric materials used in these high voltage circuits.

SUMMARY

This patent document discloses high voltage switches that include one or more electrically floating conductor layers that are isolated from one another in the dielectric medium between the top and bottom switch electrodes. The presence of the one or more electrically floating conductor layers between the top and bottom switch electrodes allow the dielectric medium between the top and bottom switch electrodes to exhibit a higher breakdown voltage than the breakdown voltage when the one or more electrically floating conductor layers are not present between the top and bottom switch electrodes. This increased breakdown voltage in the presence of one or more electrically floating conductor layers in a dielectric medium enables the switch to supply a higher voltage for various high voltage circuits and electric systems. This patent document also discloses various high voltage generators and high voltage charging circuits.

In one aspect, a high voltage switch is disclosed. This high voltage switch includes: a first switch electrode; a second switch electrode that is spaced from the first switch electrode to provide a space between the first and second switch electrodes; a dielectric material that occupies at least a portion of the space between the first and second switch electrodes; and a conductor layer located in the space between the first and second switch electrodes. The conductor layer is not connected to the first switch electrode or the second switch electrode. The high voltage switch also includes a switch control circuit coupled to the first and second switch electrodes to supply a switch control voltage across the first and second switch electrodes to create a conductive path between the first and second switch electrodes when the switch control voltage is at or above a switch-on voltage.

In one aspect, a high voltage generator having a high breakdown voltage is disclosed. This high voltage generator includes: a first electrode; a second electrode that is spaced from the first electrode to provide a space between the first and second electrodes; a dielectric material that occupies at least a portion of the space between the first and second electrodes; and a conductor layer located in the space between the first and second electrodes. The conductor layer is not connected to the first electrode or the second electrode. The high voltage generator also includes power supply coupled to the first and second electrodes to generate a voltage across the first and second electrodes up to the breakdown voltage of the space between the first and second electrodes.

In another aspect, a high voltage structure having a high breakdown voltage is disclosed. This high voltage structure includes: a first electrode; a second electrode that is spaced from the first electrode to provide a space between the first and second electrodes; and a dielectric material that occupies at least a portion of the space between the first and second electrodes. The high voltage structure also includes one or more conductor layers located in the space between the first and second electrodes, wherein the conductor layers are not connected to the first electrode or the second electrode, and wherein the conductor layers partition the space between the first and second electrodes into multiple sections.

In yet another aspect, a high voltage source is disclosed. This high voltage source includes a multilayer stack of thin piezoelectric layers separated by dielectric layers, wherein each piezoelectric layer is positioned between two dielectric layers which isolate the piezoelectric layer from other piezoelectric layers. The high voltage source also includes one or more drive signals coupled to the multilayer stack to produce a high voltage output.

In some implementations, the multilayer stack is a piezoelectric transformer having a primary section and a secondary section which are side by side to each other. The primary section receives the one or more drive signals and the secondary section generates the high voltage output. The one or more drive signals are mechanical drive signals.

In some implementations, the multilayer stack is further divided into a set of substructures, and the one or more drive signals include a set of mechanical drive signals that are individually applied onto the set of substructures. The high voltage output is a combined voltage of the individual outputs from the set of substructures.

In some implementations, the high voltage source is coupled to a high voltage switch to form an accelerator.

BRIEF DESCRIPTION OF THE FIGURES

FIGS. 11A-11B show exemplary gap-partitioned switches.

FIG. 13 shows an exemplary mounting scheme for a set of partition conductors having field-enhancement features.

DETAILED DESCRIPTION

This patent document discloses high voltage switches that include one or more electrically floating conductor layers that are isolated from one another in the dielectric medium between the top and bottom switch electrodes. The presence of the one or more electrically floating conductor layers between the top and bottom switch electrodes allow the dielectric medium between the top and bottom switch electrodes to exhibit a higher breakdown voltage than the breakdown voltage when the one or more electrically floating conductor layers are not present between the top and bottom switch electrodes. This increased breakdown voltage in the presence of one or more electrically floating conductor layers in a dielectric medium enables the switch to supply a higher voltage for various high voltage circuits and electric systems.

Figure 1:
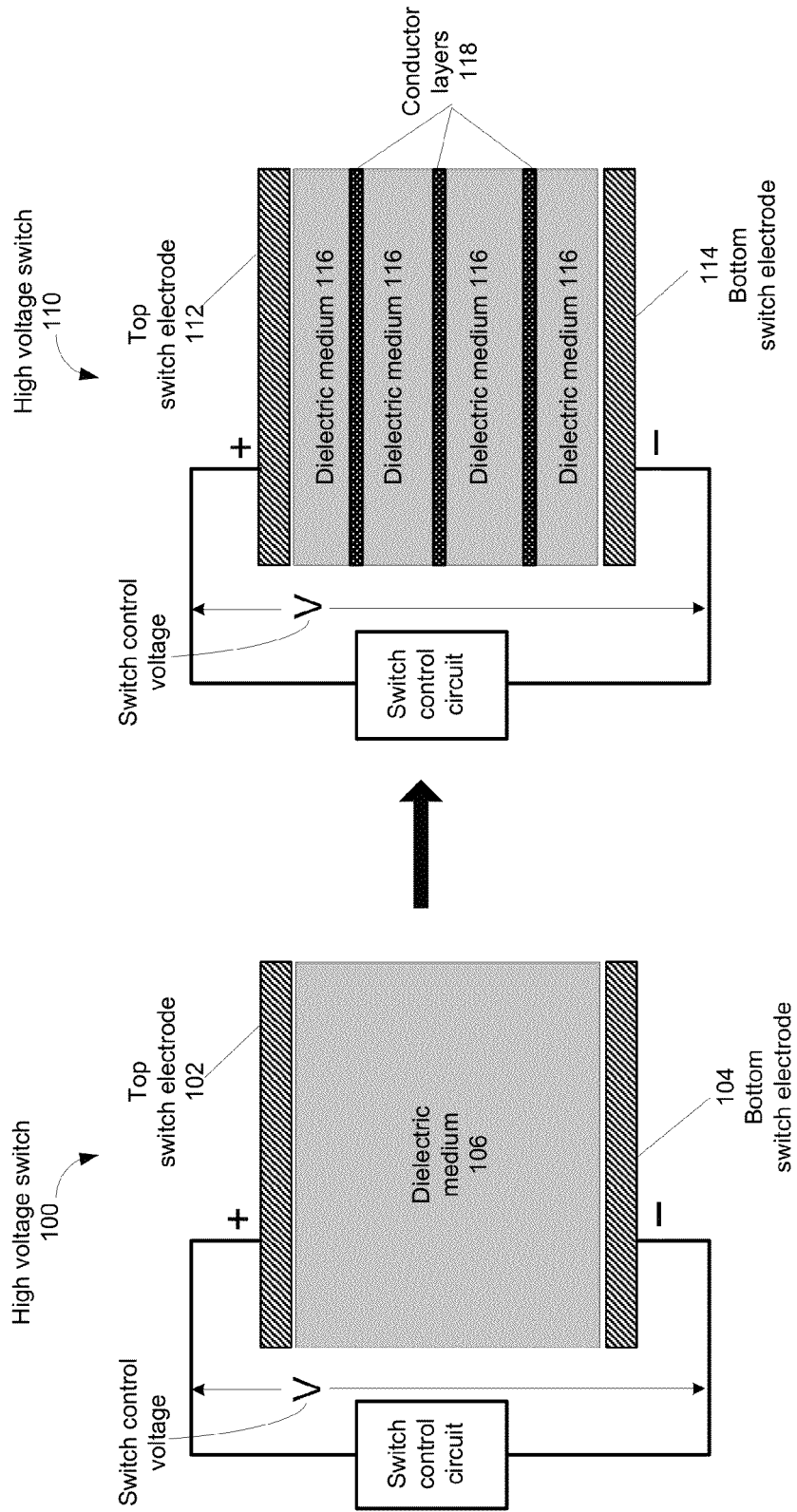
FIG. 1 shows the concept of increasing breakdown voltage of a high voltage switch by dividing a gap between a pair of switch electrodes into sections with floating conductor layers.

FIG. 1 shows the concept of increasing breakdown voltage of a high voltage switch by dividing a gap between a pair of switch electrodes into sections with floating conductor layers. The left diagram in FIG. 1 represents an exemplary conventional high voltage switch 100 comprising a pair of switch electrodes, top switch electrode 102 and bottom switch electrode 104 and a dielectric medium 106 between the pair of switch electrodes 102 and 104. A switch control voltage V generated by a switch control circuit is applied to the pair of switch electrodes and the switch 100 is ON if the voltage is above the breakdown voltage of the switch. Note that there is no other conductor between the pair of switch electrodes and the breakdown voltage of switch 100 is limited.

In contrast, the right diagram in FIG. 1 represents an exemplary high voltage switch 110 with partitioned dielectric layers by conductor layers between a pair of switch electrodes. As shown in FIG. 1, switch 110 also includes a pair of switch electrodes, top switch electrode 112 and bottom switch electrode 114 and dielectric medium 116 between the pair of switch electrodes 112 and 114. However, dielectric medium 116 and the space between the pair of switch electrodes 112 and 114 are partitioned into sections or layers by a set of conductor layers 118 embedded in the dielectric medium 116. Note that at least one of the conductor layers 118 is a floating conductor which is electrically isolated from both electrodes 112 and 114 and other conductors layers.

The design of switch 110 exhibits or effectuates a much higher breakdown voltage than that of switch 100 when operated under a switch control voltage V. The general concept of partitioning a dielectric medium with conductors can be used to implement high voltage switches in many configurations. For example, a composite dielectric material formed by alternating electrically floating conductor layers and dielectric layers as a high gradient insulator material may be used between the top and bottom switch electrodes to form a high voltage switch. For another example, when two or more conductor layers 116 are present between the top and bottom switch electrodes 112 and 114, only one conductor layer may be electrically floating while one or more other conductor layers may be connected to another conductor layer or to another circuit or signal source.

While the example of FIG. 1 shows three conductor layers 116, other switch configurations can have fewer or more, but at least one conductor layer between the pair of switch electrodes 112 and 114. While the example of FIG. 1 shows the conductor layers 116 being equally spaced in the vertical direction, other switch configurations can have unevenly spaced conductors layers. Further, while the example of FIG. 1 shows the three conductor layers 116 having a flat shape or geometry, other switch configurations can have one or more conductor layers having curved shapes. Moreover, while the example of FIG. 1 shows the conductor layers 116 having the same thickness and width, other switch configurations can include at least on conductor layer having different thickness and width from other conductor layers. While FIG. 1 shows the dielectric medium 116 being the same material in different sections between switch electrodes 112 and 114, other switch configurations can have dielectric medium within a section (i.e., a space between either a pair of adjacent conductor layers or a switch electrode and a conductor layer) being different from dielectric medium within another section. We now provide an analysis of a gap-partitioned switch to obtain high breakdown voltage.

The following analysis is based on a switch using dielectric liquid medium such as oil. According to G. A. Mesyats, Pulsed Power, section 5.2 (2005) (hereinafter Mesyats), the breakdown strength of dielectric liquids over nanosecond-class periods may be "described satisfactorily" by:

$$\log E = A - B \log t, \tag{1}$$

wherein E is the breakdown electric field in MV/cm, t is the pulse length in ns, $$A = k_1 - k_2 \log d, \tag{2}$$

$$B = k_3 - k_4 \log d,$$

wherein d is the gap spacing in cm, and the values of k parameters depend on the type of liquid and the gap geometry and polarity.

Figure 2:
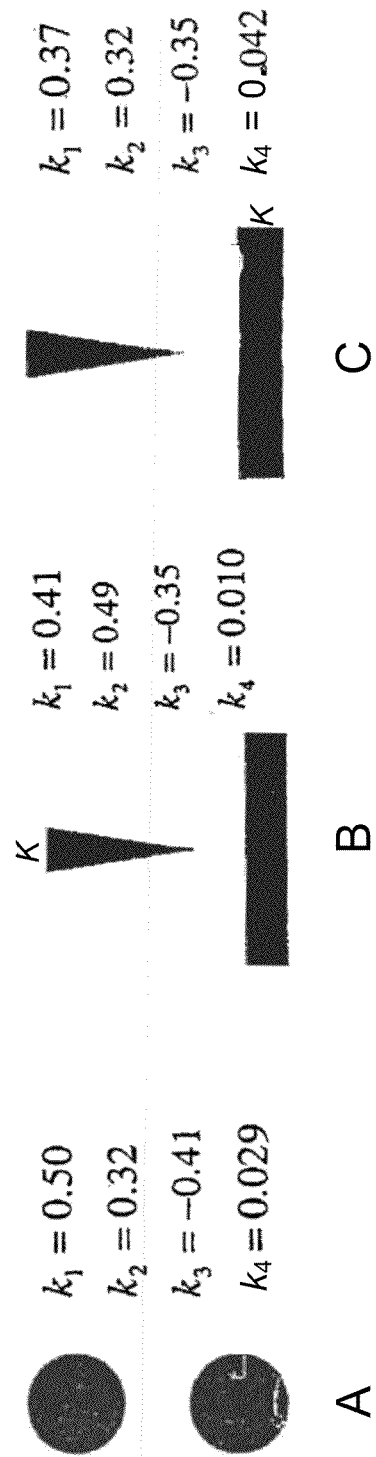
FIG. 2 shows values of k parameters for three exemplary electrode configurations.
Figure 3:
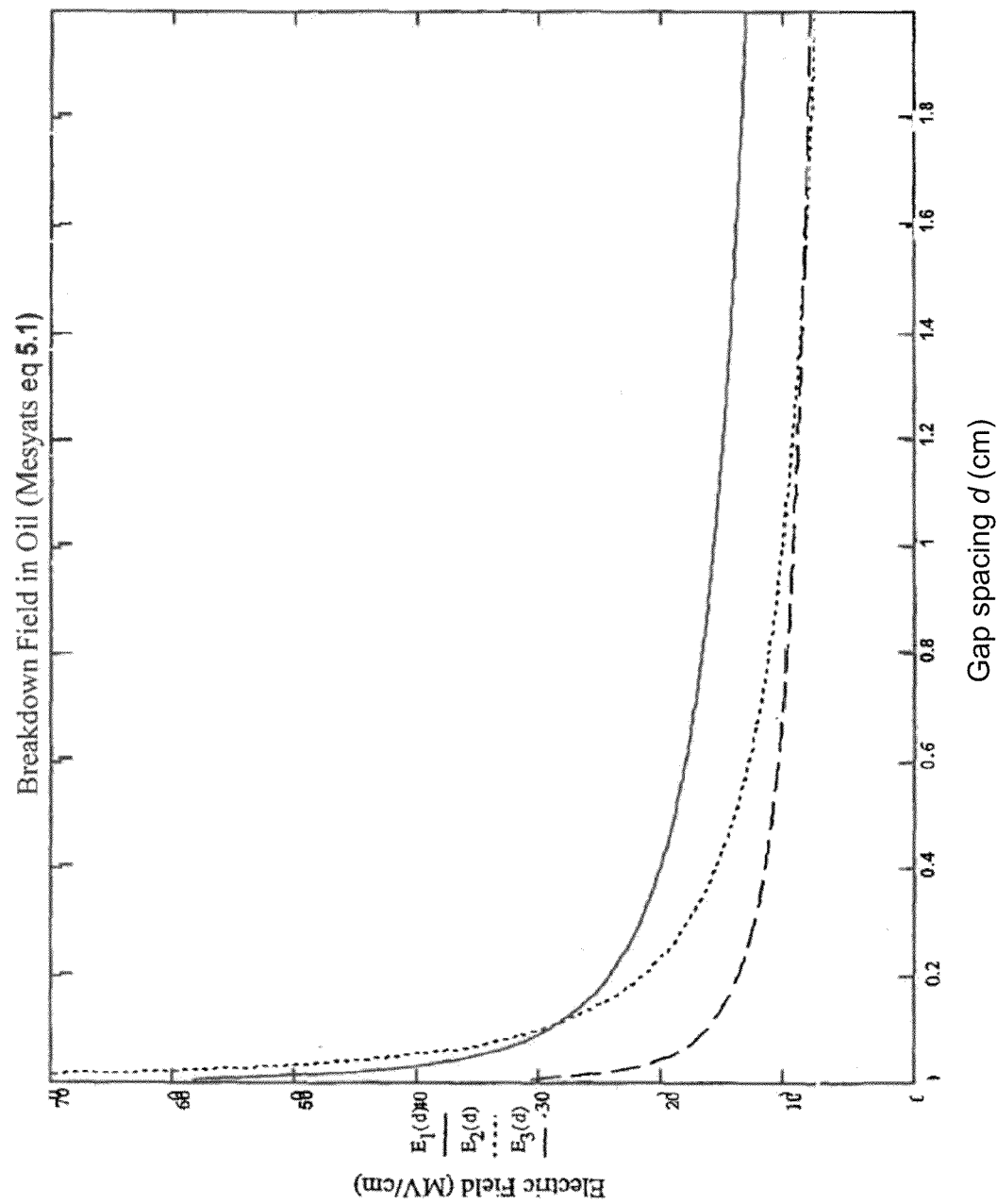
FIG. 3 shows a plot of the resulting breakdown field in oil medium as a function of gap spacing d between a pair of electrodes for each of the exemplary switches shown in FIG. 2.

FIG. 2 shows values of k parameters for three exemplary electrode configurations A, B, and C in Mesyats. In FIG. 2, label "K" indicates the location of the cathode of the switch. FIG. 3 shows a plot of the resulting breakdown field in oil medium as a function of gap spacing d between a pair of electrodes for each of the exemplary switches shown in FIG. 2. As can be observed in FIG. 3, in each of the exemplary switches, the breakdown electric field increases nonlinearly with decreasing gap spacing d.

Figure 4:
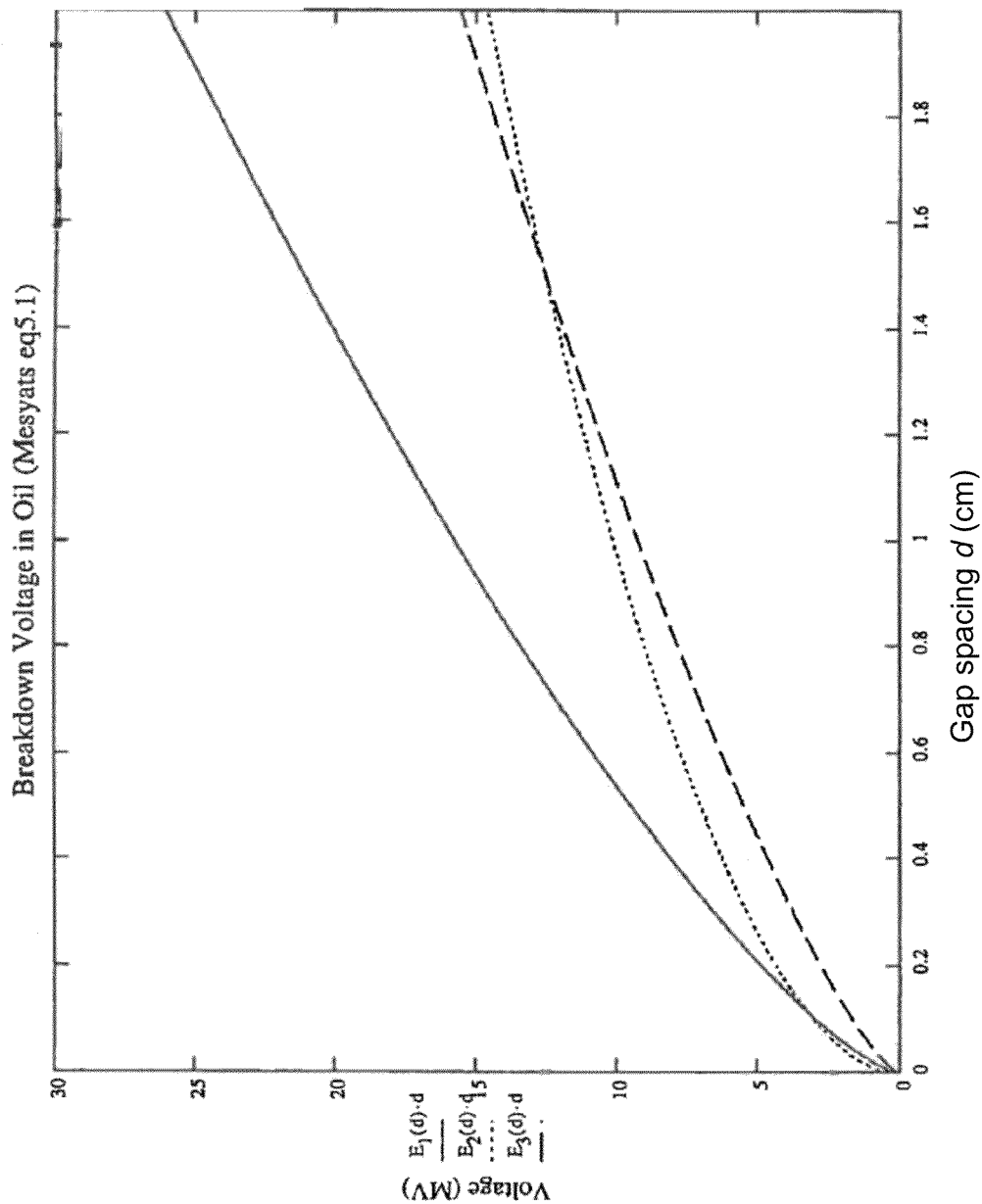
FIG. 4 shows a plot of the breakdown voltage in oil medium as a function of gap spacing d between a pair of electrodes for each of the exemplary switches shown in FIG. 2.

FIG. 4 shows a plot of the breakdown voltage in oil medium as a function of gap spacing d between a pair of electrodes for each of the exemplary switches shown in FIG. 2. In generating the plot, applied voltage having a pulse length of 50 ns are assumed in all configurations. As can be seen in FIG. 4, in each of the exemplary switches, the gap breakdown voltage increases with increasing gap spacing d. We can consider the effect of partitioning the gap between the electrodes of the switch.

Figure 5A:
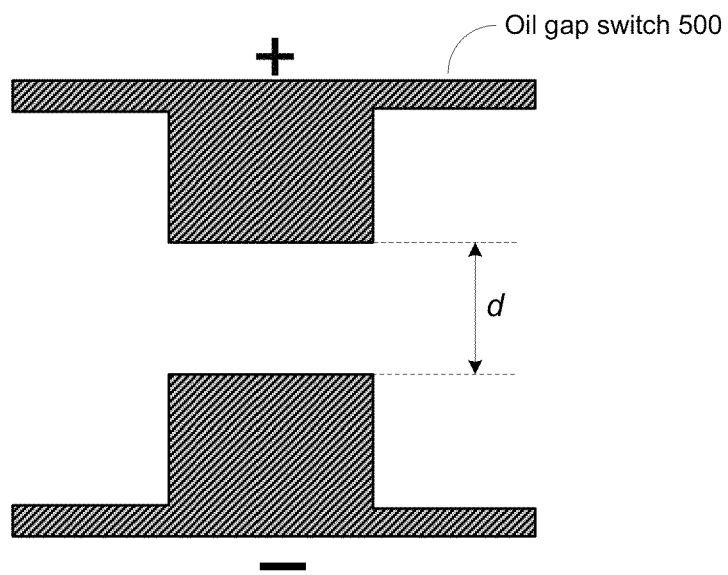
FIG. 5A shows a standard oil gap switch with a gap spacing d.

FIG. 5A shows a standard oil gap switch 500 with a gap spacing d. The switch configuration in FIG. 5A is different than any of the configurations shown in FIG. 2. However, all three of switch configurations in FIG. 2 exhibit the same trends for both breakdown field and breakdown voltage as a function of the gap spacing. It is also assumed that the standard configuration shown in FIG. 5A follows the same trend for both the breakdown field and breakdown voltage. Because the standard configuration in FIG. 5A is most similar to the two-sphere configuration A in FIG. 2, the k values in the two-sphere configuration are properly used for the standard configuration. While the results may not be exact, the qualitative trends can be made without taking into account of the edge effects in the standard configuration. For the standard switch configuration 500, the breakdown voltage may be related to the breakdown field by:

$$V = E(d)d, \tag{4}$$

wherein the breakdown field in the gap is a function of gap spacing d.

Figure 5B:
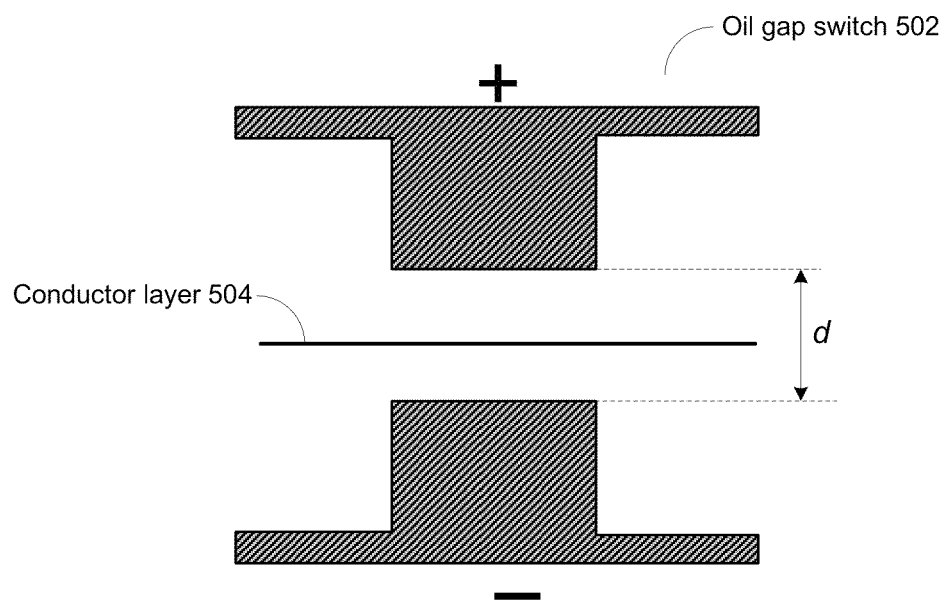
FIG. 5B shows a modified oil gap switch obtained by placing an infinitely-thin conductor layer substantially in the middle of the gap d of the standard oil gap switch.

FIG. 5B shows a modified oil gap switch 502 obtained by placing an infinitely-thin conductor layer 504 substantially in the middle of the gap d of switch 500. In this modified configuration, the breakdown voltage becomes:

$$V = 2E\left(\frac{d}{2}\right)\left[\frac{d}{2}\right]. \tag{5}$$

Similarly, if there are two conductive layers in the gap, the breakdown voltage becomes:

$$V = 2E\left(\frac{d}{3}\right)\left[\frac{d}{3}\right], \tag{6}$$

And in general for a gap region partitioned into n sections by n−1 conductive layers, the breakdown voltage can be expressed as:

$$V = 2E\left(\frac{d}{n}\right)d. \tag{7}$$

Figure 6:
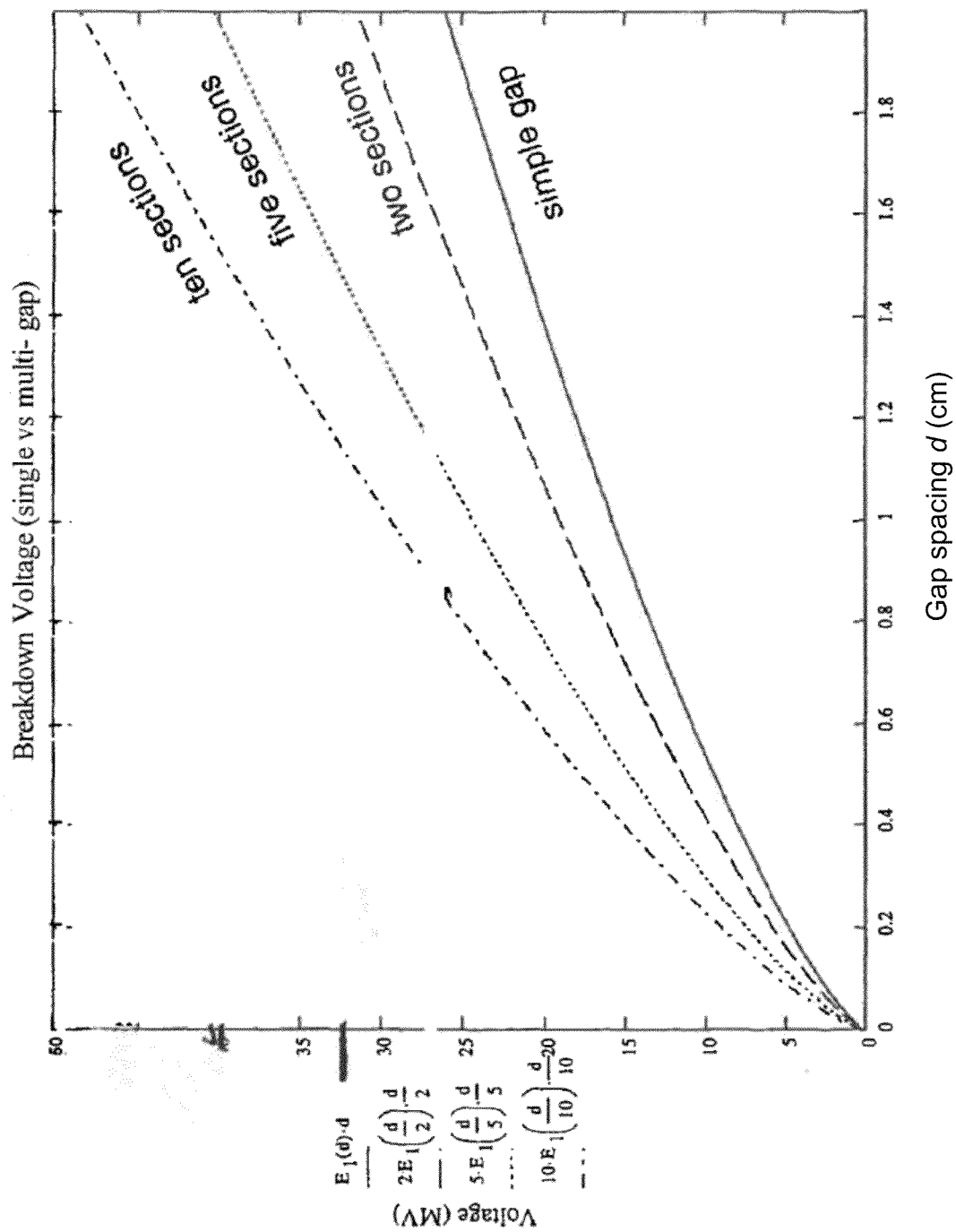
FIG. 6 shows a plot of a set of breakdown voltage vs. gap spacing curves for different exemplary modified oil gap switches (i.e., two-section gap, five-section gap, and ten-section gap), and the standard gap switch.

FIG. 6 shows a plot of a set of breakdown voltage vs gap spacing curves for different modified oil gap switches (i.e., two-section gap, five-section gap, and ten-section gap), and the standard gap switch. The data in FIG. 6 shows that increasing the number of (infinitely-thin) conductor layers between the switch electrodes increases the breakdown voltage for a given electrode spacing. This result can be explained as the breakdown electric field increases with decreasing gap spacing. Hypothetically, if the breakdown field strength was a constant, then there would be no effect on the breakdown voltage from partitioning the gap; and if the breakdown field strength increased with increasing gap spacing, then partitioning the gap would result in lower breakdown voltage.

Figure 7:
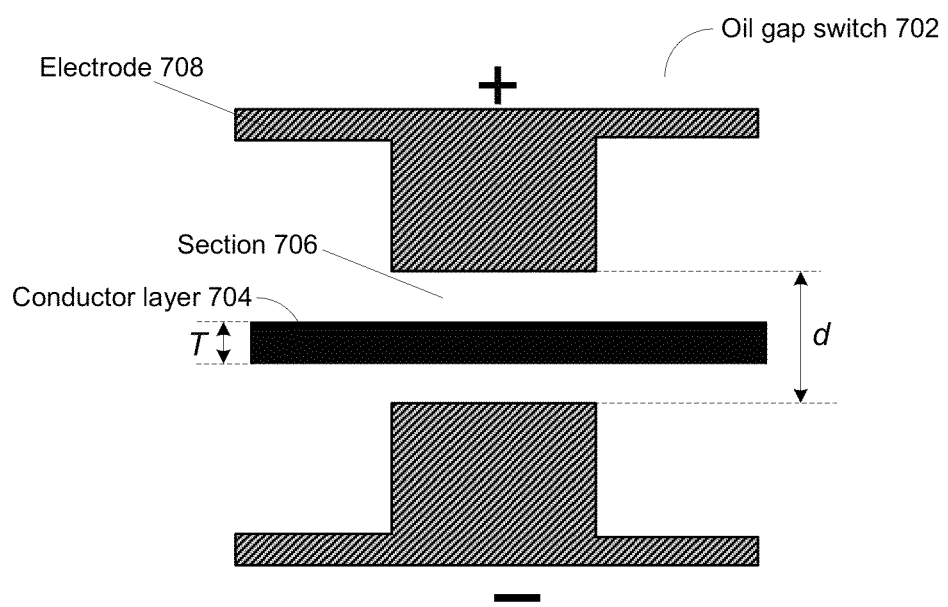
FIG. 7 shows an exemplary modified oil gap switch obtained by placing a conductor layer of finite thickness T substantially in the middle of the gap d of the standard gap switch.

The above discussion is based on the assumption that the conductive layers are infinitely thin. Practical conductors will have finite thickness, T, which needs to be taken into account. FIG. 7 shows a modified oil gap switch 702 obtained by placing a conductor layer 704 of finite thickness T substantially in the middle of the gap d of switch 500. In this case, the breakdown voltage in the upper section 706 can be computed as $$V = E\left(\frac{d-T}{2}\right)\left[\frac{d-T}{2}\right],$$

where $$\frac{d-T}{2}$$

is the effective gap length between the upper electrode 708 and the center conductor 704. Therefore, the total breakdown voltage of the switch becomes:

$$V = 2E\left(\frac{d-T}{2}\right)\left[\frac{d-T}{2}\right]. \tag{8}$$

Adding a second conductor to make a three-section switch will double the total thickness of the conductors between the original electrodes, so that the breakdown voltage becomes:

$$V = 3E\left(\frac{d-2T}{3}\right)\left[\frac{d-2T}{3}\right]. \quad (9)$$

In general, for n sections from n−1 conductive layers, the breakdown voltage is:

$$V = E\left(\frac{d-(n-1)T}{n}\right)[d-(n-1)T]. \quad (10)$$

Figure 8:
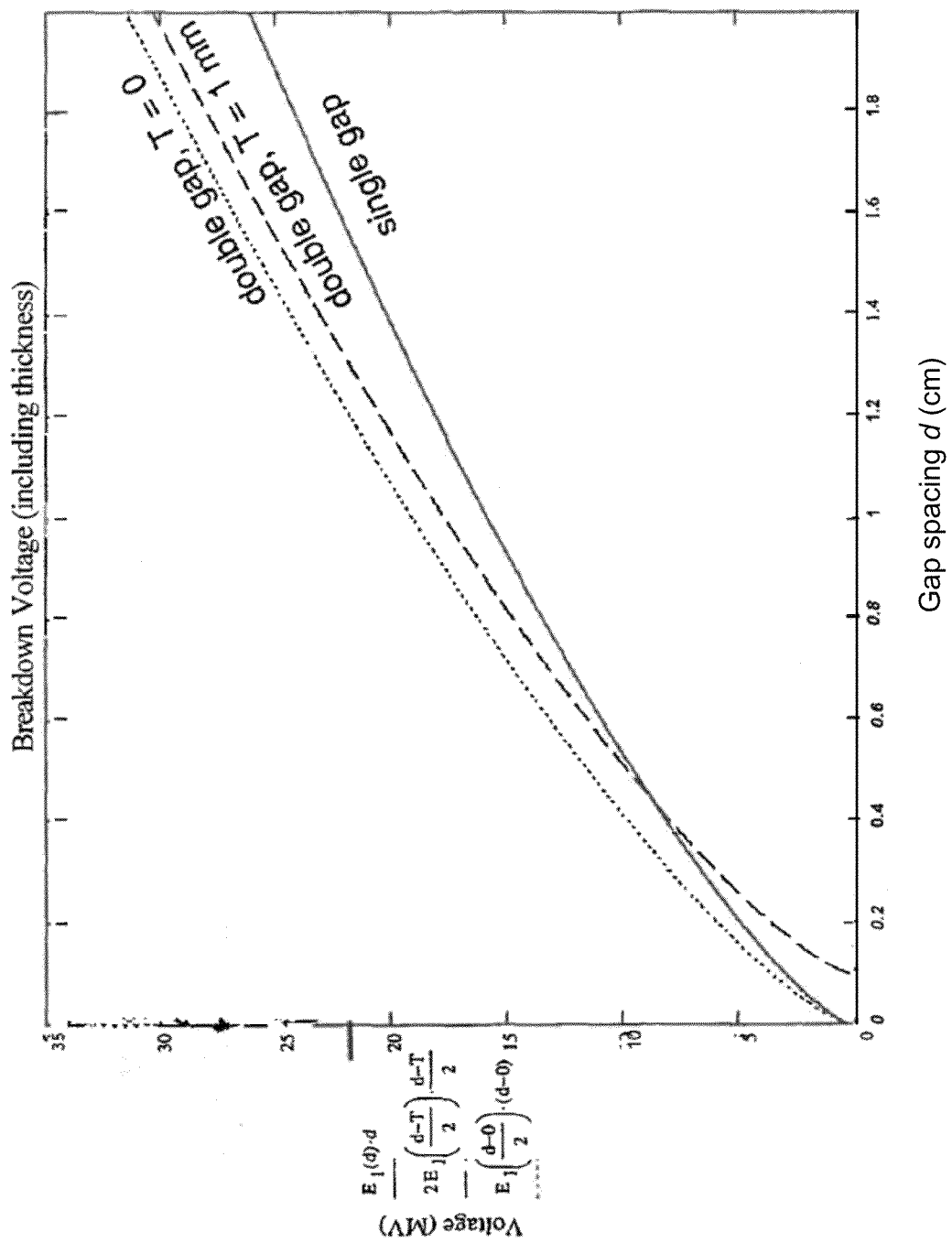
FIG. 8 shows the effect of the conductor thickness on the breakdown voltage-gap spacing relationships.

FIG. 8 shows the effect of the conductor thickness on breakdown voltage-gap spacing relationships. Note that FIG. 8 compares three switches: the standard switch, the modified switch with a single conductor that is infinitely-thin, and a modified switch with a single conductor with a finite thickness of 1 mm. The data in FIG. 8 shows that adding an infinitely-thin conductive layer between the original electrodes of the standard switch causes the modified switch to have higher breakdown voltage at almost all electrode spacings d. However, if the conductive layer has finite thickness, the breakdown voltage of the modified switch will be increased so long as the layer thickness T is small compared to the original gap spacing (i.e., T<<d), but the breakdown voltage may be reduced when the layer thickness and gap spacing become comparable (typically when d>T>d/4). When the gap spacing equals the conductive layer thickness T, the breakdown voltage becomes zero—which is reasonable because the switch has now become a single conducting path.

Figure 9:
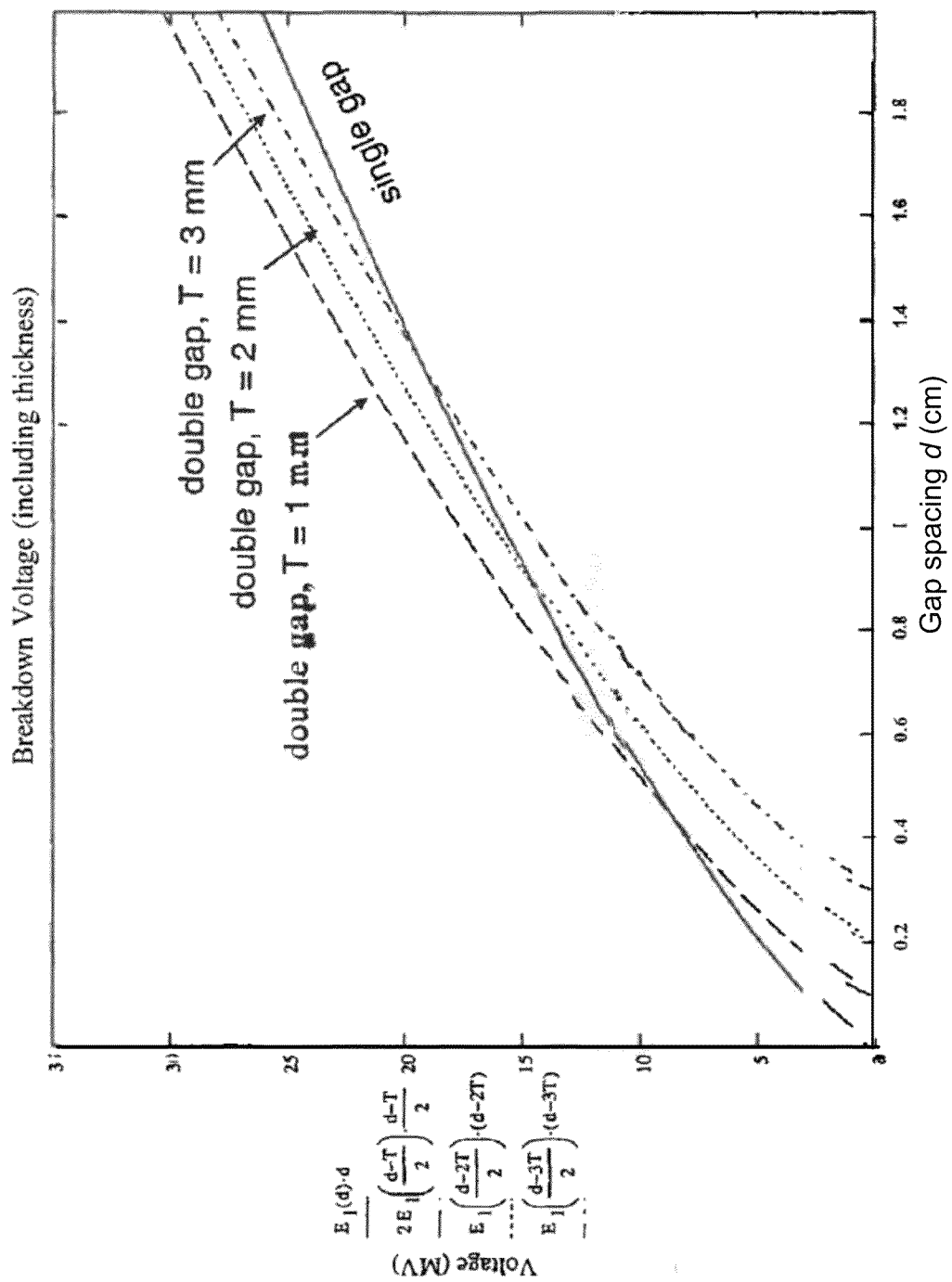
FIG. 9 shows the effect of increasing conductor layer thickness in two-section switches on the breakdown voltage-gap spacing relationships compared with the standard single gap switch.

FIG. 9 shows the effect of increasing conductor layer thickness in two-section switches on the breakdown voltage-gap spacing relationships compared with the standard single gap switch. As can be seen in FIG. 9, as the single conductor layer thickness increases, the improvement on the breakdown voltage over the standard single gap switch can be significantly deduced.

Figure 10:
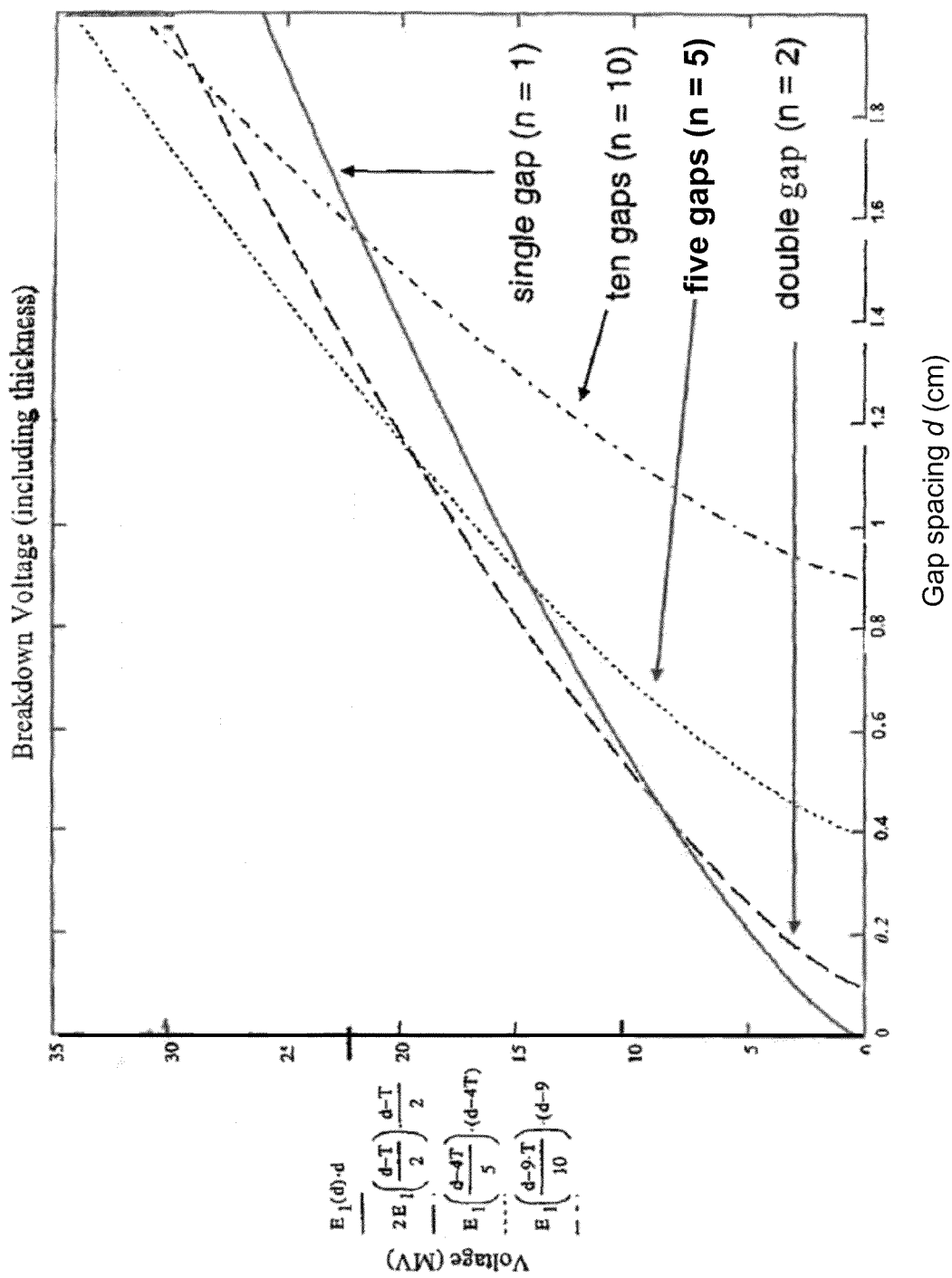
FIG. 10 shows the effect of increasing the number of sections within a switch while keeping the conductive layers thickness constant on the breakdown voltage-gap spacing relationships.

FIG. 10 shows the effect of increasing the number of sections within a switch while keeping the conductive layers thickness constant (1 mm) on breakdown voltage-gap spacing relationships. Note that for a modified switch with n sections, or n−1 conductive layers, the requirement for improved breakdown voltage is (n−1)T<<d. Provide that this requirement is preserved, increasing the number of sections n will increase the breakdown voltage of the modified switch. The results shown in FIG. 10 may be explained as follows. Note that a major design objective is to make a switch which can operate at higher voltages without increasing its volume. To do so, the designs can take advantage of the fact that a smaller switch gap (e.g., in an oil gap switch) facilitates achieving a higher breakdown field. This higher breakdown field can be turned into a higher breakdown voltage by partitioning the single gap into multiple small gaps. However, any amount of gap spacing occupied by the conductor layers cannot be used as the gap space, and therefore reduces the spatial efficiency of the system. Hence, there is an upper limit of the number of sections for a give gap spacing d when further increasing the number of sections provides no more improvement but causing breakdown voltage decrease.

Note that the above characteristic curves of breakdown field with respect to distance are generated based on an oil gap switch but are applicable to various types of liquids, and hence switches using liquids other than oil can also be operated on the same principles.

In addition to the above described high voltage switch design parameters, there are a number of other factors to consider in designing a gap-partitioned switch.

Oil flow. For an oil gap switch, the design should allow for flow of oil through the switch layers, and preferably parallel to the conductors, to allow removing contaminated oil and keeping the electrodes clean.

Mechanical rigidity. This requirement is necessary to maintain electrode spacing, and therefore to maintain reproducible operation in a given switch.

Arcing location. The simplest form of conductor that can be added to partition a switch gap is typically a flat plate of metal. However, the edges of such a plate can cause field enhancement, resulting in arcing at unwanted locations, and possibly an overall reduction in voltage holding capability of the switch. In some embodiments, this "edge" effect may be minimized, possibly by bending or "curling" the partition conductors away from each other at the edges of the switch. Conversely, in some embodiments, this edge effect may be used to deliberately cause field enhancement to ensure that any breakdown occurs at the desired location.

Size. Small switch sizes may be preferred in designing a compact system. Sometime a partitioned switch would require additional amounts of volume relative to the active region of the switch. In such a case, a standard single-gap switch may be preferred to a partitioned switch.

Compatibility with oil. For an oil gap switch, the materials used to support the partition conductor(s) in the gap should be compatible with oil. In addition, when heated or damaged by arcing, these supporting structures should maintain compatible with oil.

Breakdown voltage/field. For an oil gap switch, the materials used to support the partition conductor(s) can have a dielectric strength greater than oil. Such materials may include high gradient insulator (HGIs).

Simplicity. A gap-partitioned switch should be generally simple to build and maintain.

Low erosion. In most cases, the metal chosen for the partition conductor(s) should not exhibit excessive erosion in order to ensure a long operating life.

FIGS. 11-12 illustrate examples of implementations of gap-partitioned switches.

FIG. 11A shows an exemplary gap-partitioned switch 1100 comprising top and bottom electrodes 1102 and 1104, and a set of axially symmetric partition conductor plates 1106. In this implementation, each of the five partition conductor plates 1106 is a floating conductor electrically isolated from both electrodes 1102 and 1104 and other conductor plates. The five conductor plates 1106 partition the gap between electrodes 1102 and 1104 into six sections.

FIG. 11B shows an exemplary gap-partitioned switch 1110 comprising top and bottom electrodes 1112 and 1114, and a set of axially symmetric partition conductors 1116. In this implementation, the middle of the three conductors 1116 is a flat plate while the top and bottom partition conductors are curved "dish" conductors. As discussed above, such "bending" or "curling" around the edge of the partition conductors can help to minimize the edge effect. The set of partition conductors 1116 creates four sections in the gap of switch 1110, and each of the three partition conductors 1106 is a floating conductor electrically isolated from both electrodes 1112 and 1114 and other partition conductors.

In each of the gap partitioned switches 1100 and 1110, the dielectric medium occupies the space in the multiple sections between the top and bottom switch electrodes. The dielectric medium can be a gas, a liquid such as an oil, a solid such as SiC, or other materials. In addition, between different conductor layers or the top and bottom switch electrodes, more than one dielectric medium may be implemented in such switches. For example, in the switch 1110 illustrated in FIG. 11B, section 1118 between top switch electrode 1112 and the top floating conductor in conductors 1116 may be filled with a first dielectric medium such as oil; whereas section 1120 between the top floating conductor in conductors 1116 and the middle floating conductor in conductors 1116 may be filled with a second, different dielectric medium, such as SiC.

Figure 12A:
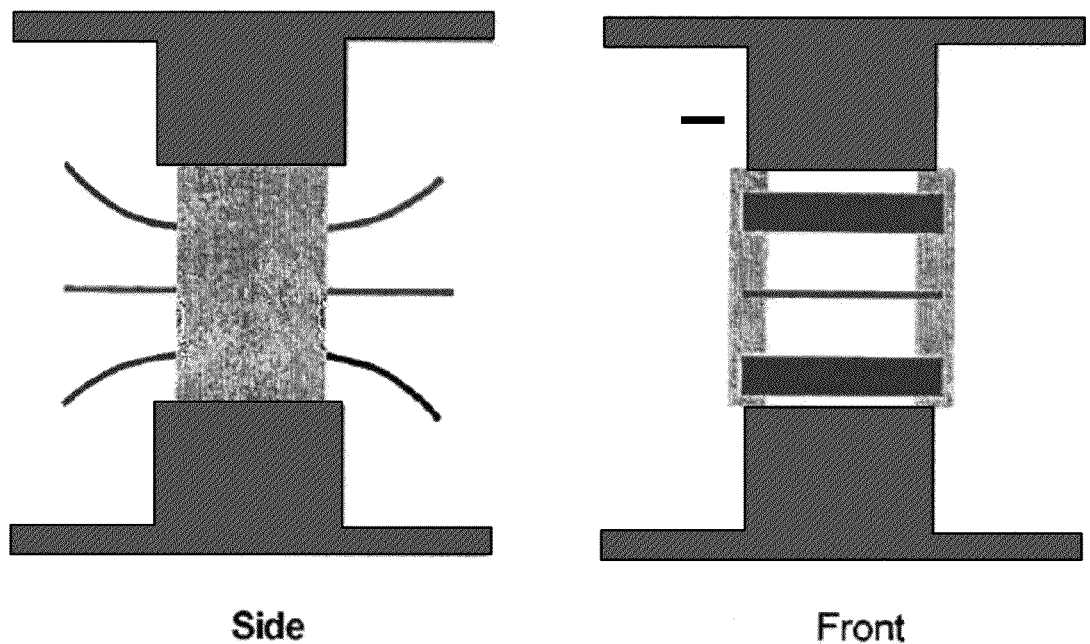
FIGS. 12A-12B show exemplary mounting schemes for the set of partition conductors in the switch of FIG. 11B.
Figure 12B:
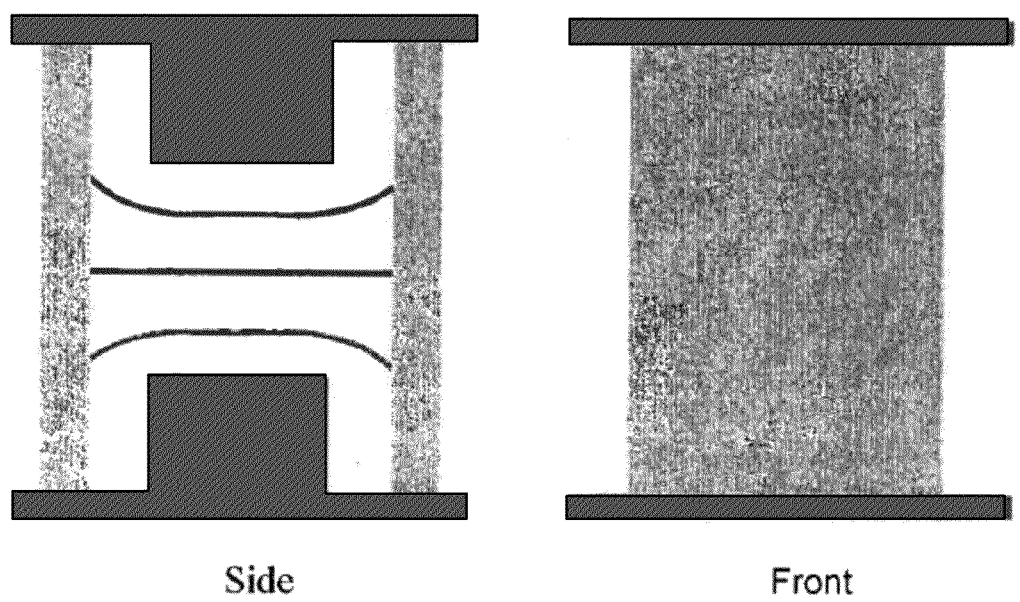

FIG. 12A shows an exemplary mounting scheme for the set of partition conductors in switch 1110 of FIG. 11B. More specifically, FIG. 12A provides both side and front views of a side-mounting method such that the support structure is attached to the set of partition conductors on the uncurled sides and also attached to inner edges of the top and bottom electrodes. FIG. 12B shows another exemplary mounting scheme for the set of partition conductors in switch 1110 of FIG. 11B. More specifically, FIG. 12B provides both side and front views of an end-mounting method such that the support structure is attached to the curled ends of the set of partition conductors and also attached to outer edges of the top and bottom electrodes. Note that the support structure in FIG. 12B is significantly larger than the support structure in FIG. 12A.

FIG. 13 shows an exemplary mounting scheme for a set of partition conductors having field-enhancement features. More specifically, each of the set of partition conductors 1302 in FIG. 13 includes a sharp feature 1304 which can be used to cause field enhancement to ensure that any breakdown occurs at the feature location. Note that these field-enhancement features increase the effective layer thickness. Moreover, FIG. 13 provides both side and front views of an end-mounting method such that the support structure 1306 is attached to the ends of the set of partition conductors and also attached to outer edges of the top and bottom electrodes.

When a given switch in the above-described high voltage switches operate under a pulsed control voltage, the pulse width during which time the switch is ON can be adjusted to achieve a higher breakdown voltage. This portion of the pulsed control voltage is also referred to as a "field dwell-time." Generally, when a shorter field dwell-time, i.e., a shorter pulse width is used, a higher breakdown voltage can be obtained.

Figure 14:
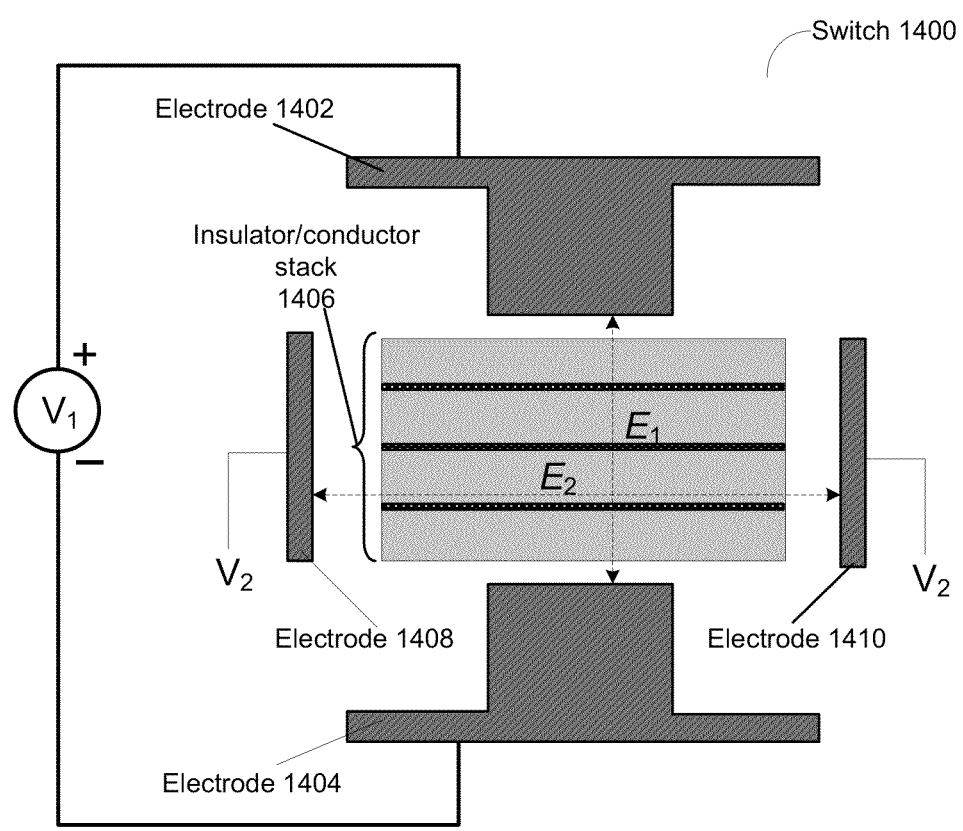
FIG. 14 illustrates an exemplary high voltage switch configured with an attenuation field.

To further increase the breakdown voltage in the above-described high voltage switches, an active attenuation technique can be used. FIG. 14 illustrates an exemplary high voltage switch 1400 configured with an attenuation field. As can be seen in FIG. 14, switch 1400 comprises top and bottom electrodes 1402 and 1404, and an insulator/conductor stack 1406 including multiple floating conductor layers. The pair of electrodes 1402 and 1404 is subjected to an applied voltage $V_1$ which produces a field $E_1$ through insulator/conductor stack 1406. Additionally, switch 1400 includes left and right electrodes 1408 and 1410 which are positioned on either end of the insulator/conductor stack 1406. The pair of electrodes 1408 and 1410 is subjected to an applied voltage $V_2$ which produces a horizontal field $E_2$ through insulator/conductor stack 1406. In one embodiment, the applied voltage $V_2$ is configured to establish a rapidly attenuating field $E_2$ perpendicular to the field $E_1$ to set up an attenuating eddy current in the floating conductor layers so that electrons do not have the time to "dwell" at a given location in the conducting layers. As a result, the switch 1400 generally has a higher breakdown voltage than a switch without the active attenuating field.

Note that in the various switches described above, we assume the applied voltage is used to enable switching operation. However, when not used for switching operation, each of these switch structures simply becomes a high voltage source with a very high breakdown voltage. Each of the disclosure structure increases breakdown voltage whether or not the structure is used as a switch. Hence, the present technology using conductor partitioned gap is limited to obtaining high voltage switches.

This patent document also discloses high voltage generators and charging systems based on stackable piezoelectric materials.

The unique attributes offered by crystal driven directional radiation sources potentially include portability, rapid deployment, directional flux (therefore no shielding requirements), low to moderate power requirements, small, compact power supply, and potential for handheld applications. The cost of such sources could be sufficient for widespread deployment within various industries.

Figure 15:
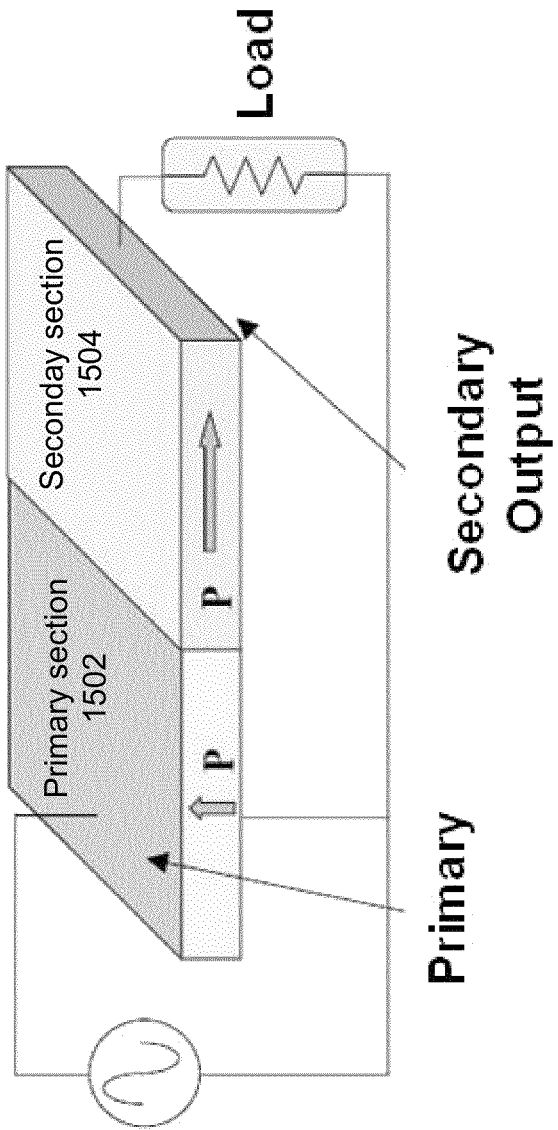
FIG. 15 shows an example of a compact piezoelectric transformer.

FIG. 15 shows an example of a compact piezoelectric transformer 1500 as a voltage transforming device that can replace, in certain applications, large and cumbersome iron core or ferrite transformers. Piezoelectric transformer 1500 shown in FIG. 15 is made of a piezoelectric material having a primary section 1502 which is a slab with a polarization perpendicular to the slab surfaces and a secondary section 1504 which is slab with a polarization parallel to the slab surfaces. As can be seen, an alternating current is applied to the primary section 1502. As a result, the whole substrate carrying both primary section 1502 and secondary section 1504 vibrates mechanically and this vibration generates a voltage on the secondary section 1504. For constant polarizations in the primary and secondary sections of the device as shown, the step-up ratio is approximately equal to the length of the secondary section 1504 divided by the thickness of the primary section 1502. Some step-up ratios for the devices can be designed to approach 1000:1.

The charging of a high voltage system such as a dielectric wall accelerator (DWA) and other high voltage devices sometimes requires isolation of the power input close to ground potential. Existing isolation techniques for overcoming this shortfall are very cumbersome. Piezoelectric transformers can be highly efficient (>90%) in this regard, but the allowable field stress is of order 20-30 kV/cm. This low limit for the allowable field stress in the material limits the total output gradient of the piezoelectric transformer 1500 shown in FIG. 15.

Figure 16:
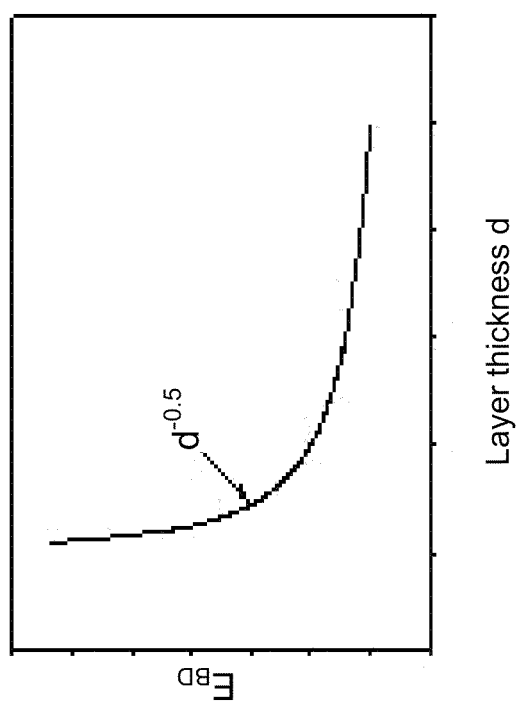
FIG. 16 shows a plot of an exemplary relationship of the breakdown strength of a piezoelectric layer to the layer thickness.

FIG. 16 shows a plot of an exemplary relationship of the breakdown strength of a piezoelectric layer to the layer thickness. This figure indicates that thinner piezoelectric layers can be used to achieve higher field stress. Therefore, it is desirable to use thin piezoelectric layers to achieve the higher field stress. It is also desirable to modify a conventional single layer structure to a multilayer structure made of a stack of isolated thin piezoelectric layers to achieve a higher piezoelectric transformer voltage output.

Figure 17:
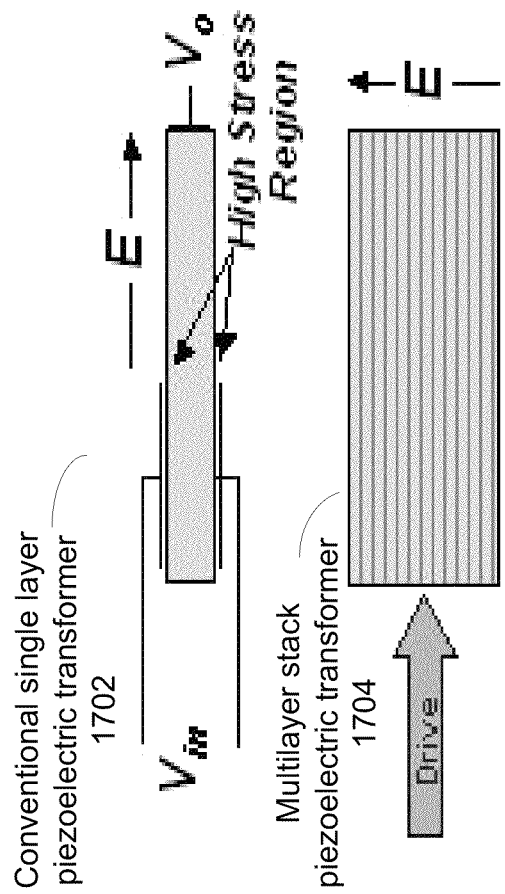
FIG. 17 shows an example of modifying a conventional single layer piezoelectric transformer that has a low breakdown field stress into a multilayer stack piezoelectric transformer.

FIG. 17 shows an example of modifying a conventional single layer piezoelectric transformer 1702 that has a low breakdown field stress into a multilayer stack piezoelectric transformer 1704. More specifically, the modified piezoelectric transformer 1704 is composed of alternating dielectric layers and thin piezoelectric layers, such that each thin piezoelectric layer is isolated from other thin piezoelectric layers in the stack by two dielectric layers. Note that for each piezoelectric layer in the stack, stacking has substantially the same effect as isolating each single thin layer because the breakdown behavior of the stack is essentially isolated to the individual layers. As a result, the stacked structure 1704 can exhibit a much higher overall breakdown field stress than the single layer device 1702. When using stacked structure 1704 as the piezoelectric transformer, a very high output voltage can be obtained compared to the conventional device 1702. Note that the dielectric layers in the stack structure 1704 can include polarizable dielectrics including nano-composite dielectrics.

Figure 18:
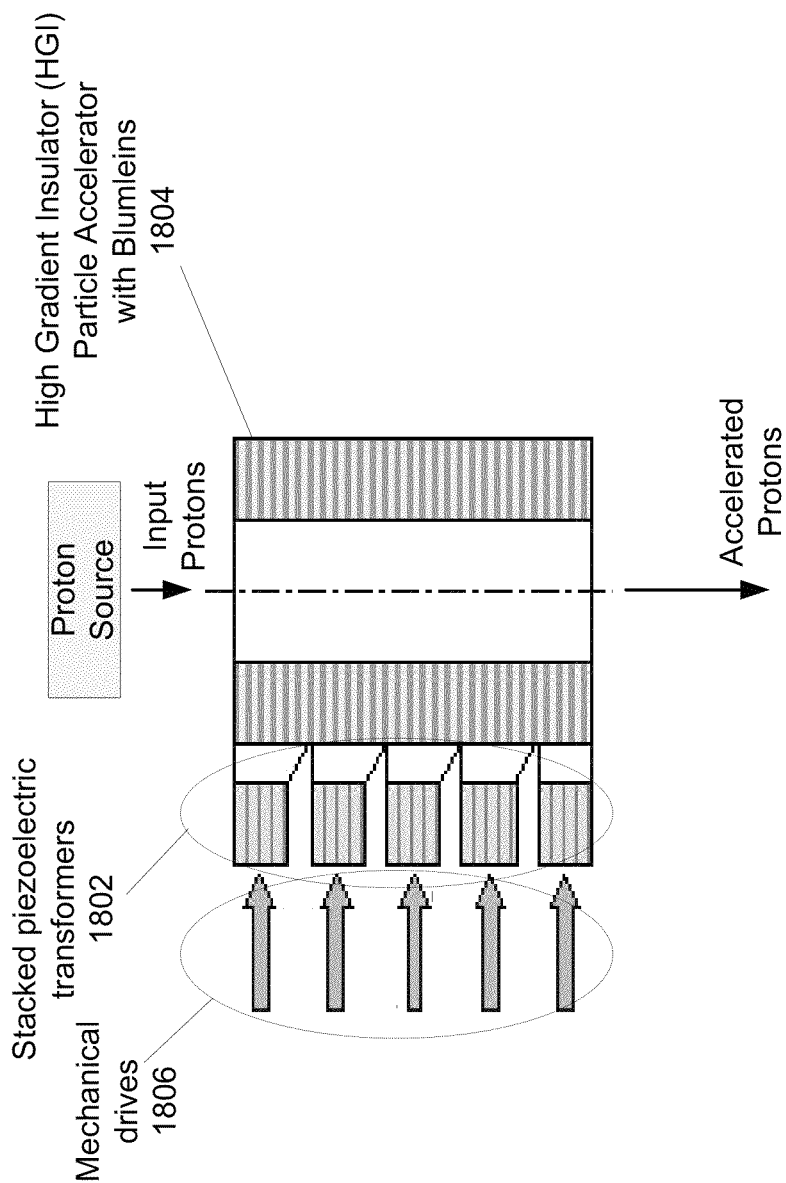
FIG. 18 shows an example of driving a stacked piezoelectric transformer and coupling the output of the stacked piezoelectric transformer to a high voltage module for an accelerator.

FIG. 18 shows an example of driving a stacked piezoelectric transformers 1802 and coupling the output of the stacked piezoelectric transformers 1802 to provide high voltages to blumleins of a high gradient insulator particle accelerator. As can be seen in FIG. 18, the stacked piezoelectric transformers 1802 may be divided into a set of substructures (five substructure shown). To operate the device, a set of mechanical drives 1806 are individually applied onto the set of substructures of transformers 1802, and each independently driven substructure generates a separate high voltage output. Note that each of the multiple mechanical drives can have a separate phase. The accelerator includes a dielectric wall accelerator (DWA) tube which can be a high gradient insulator (HGI) tube that has a stack structure of alternating dielectric layers and conductor layers. The blumleins are placed outside the HGI tube to receive the high voltages from the stacked piezoelectric transformers 1802. A charged particle source such as a proton source is used to produce the initial input charged particles into the HGI tube and the received charged particles are accelerated inside the HGI tube by the synchronized operations of the stacked piezoelectric transformers 1802 and the blumleins.

Charged beam acceleration in the proposed accelerator structure shown in FIG. 18 can occur at peak charge and the highest voltage of the accelerator. To achieve a higher peak current, a DWA structure such as an auxiliary switch/Blumlein structure shown in the lower part of FIG. 19 can be used. A factor of up to two gain may also be achievable through the resonant charge action of the piezoelectric and lower capacitance of the Blumlein structure.

In operation, a series of Blumleins unit cells are coupled to a HGI tube to receive a pulse of charged particles (e.g., protons) propagating along a tube lengthwise direction. A particle focusing device can be used to focus the charged particles into the HGI tube that provides an accelerating electric field along the longitudinal or tube lengthwise direction (z) for accelerating the charged particles. The focusing device can include to a radio frequency quadrupole (RFQ) that provides focusing, bunching and acceleration for the charged particles.

Such particle accelerators are used to increase the energy of electrically-charged particles, e.g., electrons, protons, or charged atomic nuclei. High energy electrically-charged particles can be used in various application. For example, high energy electrically-charged particles can be accelerated to collide with a target such as atoms or molecules to break up the nuclei of the target atoms or molecules and interact with other particles. The resulting products are observed with a detector. At very high energies the accelerated charged particles can cause transformations in a target caused by the collision which can be used to discern the nature and behavior of fundamental units of matter. Particle accelerators are also important tools in the effort to develop nuclear fusion devices, and in medical applications such as proton therapy for cancer treatment, which is also known as hadron therapy.

The Blumleins unit cells are located outside, and engaged to, different tube sections of the HGI tube. The unit cells each include parallel electrical conductor lines transversely connected to the different tube sections, respectively, and spaced apart along the tube lengthwise direction to apply electrical signals to effectuate acceleration electrical fields at the different tube sections along the tube lengthwise direction inside HGI tube. A control device is coupled to the Blumleins unit cells to supply electrical power to the parallel electrical conductor lines within the Blumleins unit cells and to control the Blumleins unit cells to turn on and off the applied electrical signals in the Blumleins unit cells, respectively, one unit cell at a time sequentially along the tube lengthwise direction to synchronize the acceleration electrical field at the different tube sections with propagation of the pulse of charged particles to accelerate the charged particles. The HGI tube is one of implementations of DWA tube and another implementation, for example, can be a contiguous dielectric material tube that is entirely made of a dielectric material.

Figure 19:
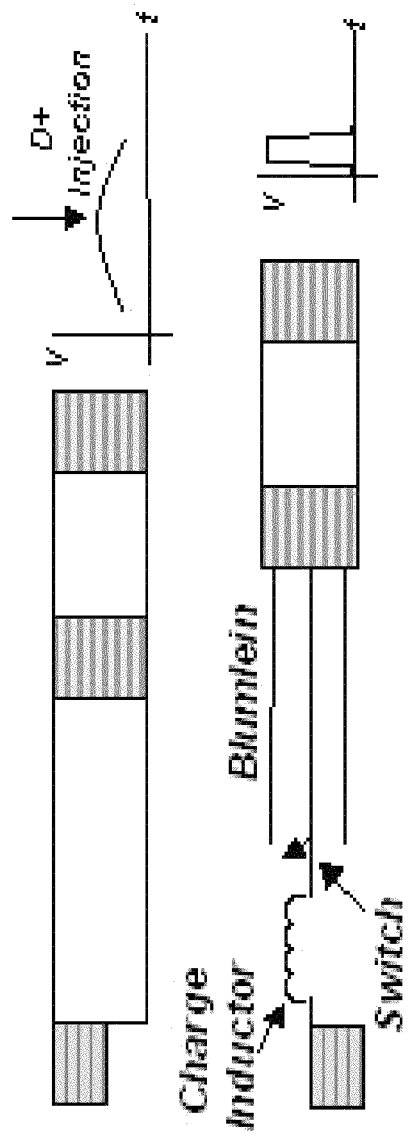
FIG. 19 shows using a dielectric wall accelerator (DWA) structure such as an auxiliary switch/Blumlein structure to achieve a higher peak current in a particle accelerator based on stacked structures.
Figure 20A:
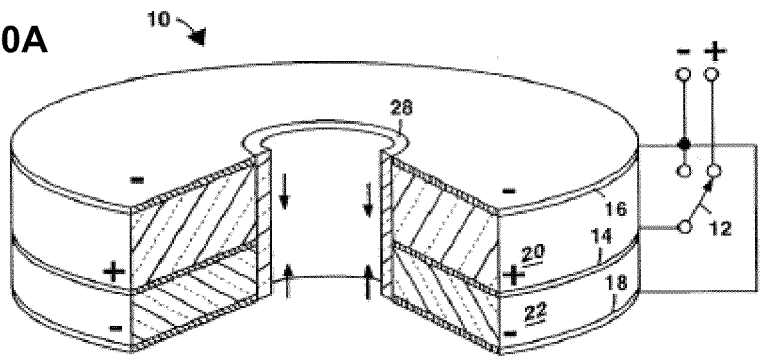
FIGS. 20A-C and 21 show examples of photoconductive SiC devices.
Figure 20B:
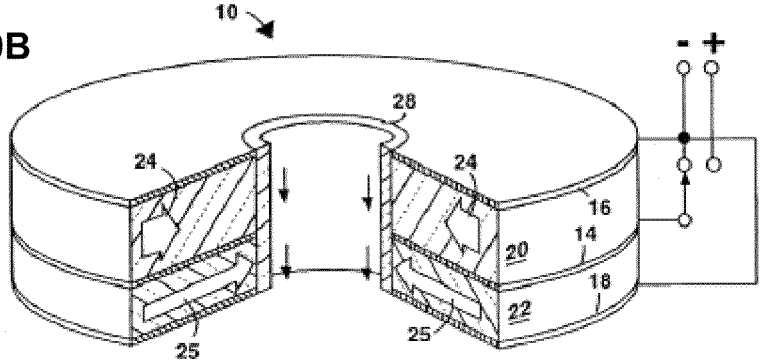
Figure 20C:
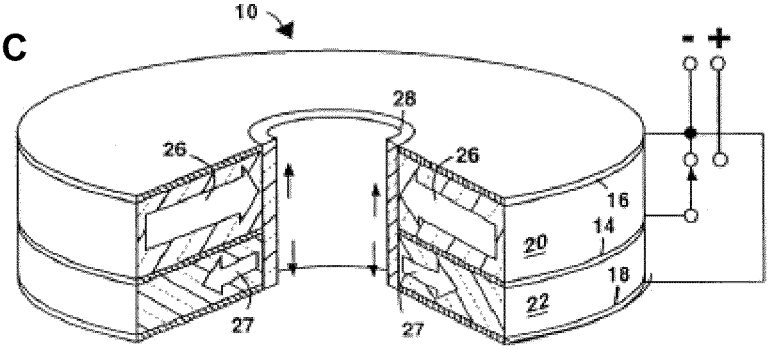

FIG. 20A, FIG. 20B and FIG. 20C provide exemplary diagrams that illustrate the operation of a single Blumlein unit cell 10 for a DWA tube section under the control of a switch 12, powered by a radial transmission line, that can be utilized as the building block for the DWA of FIGS. 18 and 19. FIGS. 20A-20C provide a time-series that is related to the state of the switch 12. A tube section 28 fabricated from a dielectric material is molded or otherwise formed on the inner diameter of the single accelerator cell 10 to provide a dielectric wall. The cut up discs are conductors as radial transmission lines. Each radial transmission line consists of a slow-medium disc and a fast-medium disc for propagation of signals, as will be described in detail below. A particle beam is introduced at one end of the dielectric wall 28 that accelerates along the central axis. The switch 12 is connected to allow the middle conductive plate 14 to be charged by a high voltage source. An insulator material 20, e.g., a laminated dielectric material, with a relatively high dielectric constant separates the conductive plates 14 and 16. Another insulator material 22, e.g., another laminated dielectric material, with a relatively low dielectric constant separates the conductive plates 14 and 18. In the exemplary diagram of FIGS. 20A-20C, the middle conductive plate 14 is set closer to the bottom conductive plate 18 than to the top conductive plate 16, such that the combination of the different spacing and the different dielectric constants results in the same characteristic impedance on both sides of the middle conductive plate 14. Although the characteristic impedance may be the same on both halves, the propagation velocity of signals through each half is not the same. The higher dielectric constant half with laminated dielectric 20 is much slower. This difference in relative propagation velocities is represented by a short fat arrow 24 and a long thin arrow 25 in FIG. 20B, and by a long fat arrow 26 and a reflected short thin arrow 27 in FIG. 20C.

In a first position of the switch 12, as shown in FIG. 20A, both halves are oppositely charged so that there is no net voltage along the inner length of the assembly. After the lines have been fully charged, the switch 12 closes across the outside of both lines at the outer diameter of the single accelerator cell, as shown in FIG. 20B. This causes an inward propagation of the voltage waves 24 and 25 which carry opposite polarity to the original charge such that a zero net voltage will be left behind in the wake of each wave. When the fast wave 25 hits the inner diameter of its line, it reflects back from the open circuit it encounters. Such reflection doubles the voltage amplitude of the wave 25 and causes the polarity of the fast line to reverse. For only an instant moment more, the voltage on the slow line at the inner diameter will still be at the original charge level and polarity. As such, after the wave 25 arrives but before the wave 24 arrives at the inner diameter, the field voltages on the inner ends of both lines are oriented in the same direction and add to one another, as shown in FIG. 20B. Such adding of fields produces an impulse field that can be used to accelerate a beam. Such an impulse field is neutralized, however, when the slow wave 24 eventually arrives at the inner diameter, and is reflected. This reflection of the slow wave 24 reverses the polarity of the slow line, as is illustrated in FIG. 20C. The time that the impulse field exists can be extended by increasing the distance that the voltage waves 24 and 25 must traverse. One way is to simply increase the outside diameter of the single accelerator cell. Another, more compact way is to replace the solid discs of the conductive plates 14, 16 and 18 with one or more spiral conductors that are connected between conductor rings at the inner and/or outer diameters.

The multiple Blumleins unit cells 10 can be arranged over a continuous dielectric wall to produce the proper axial accelerating electric fields at different positions to accelerate the charged particles through the central axis of the multi-stage DWA by sequentially generating the appropriate voltage pulse for each section of the multi-stage DWA. As such, by timing the closing of the switches (as illustrated in FIGS. 20A to 20C), the generated electric field on the dielectric wall can be made to move at any desired speed. In particular, such a movement of the electric field can be made synchronous with the proton beam pulse that is input to the DWA, thereby accelerating the proton beam in a controlled fashion that resembles a "traveling wave" that is propagating down the DWA axis. It is advantageous to make the duration of these pulses as short as possible since the DWA can withstand larger fields for pulses with narrow durations.

The above disclosed techniques for using one or more electrically floating conductor layers that are isolated from one another in the dielectric medium between the top and bottom switch electrodes can also be integrated into electronic switches, circuits and devices that use photoconductive wide bandgap (WBG) materials that are activated by radiation such as laser light to effectuate an electronic switch or modulator while increasing the effective breakdown voltages in such devices.

A WBG photoconductive switch or modulator can include a substrate of a photoconductive WBG material placed in contact with and located between top and bottom electrodes. In absence of radiation or at a low level of radiation below a threshold, the photoconductive WBG material behaves as an insulator with a large resistance value (e.g., much larger than the circuit impedance) and thus essentially blocks the current flow across the two electrodes in contact with the photoconductive WBG material. When radiation energy is directed into the WBG material and is absorbed, the WBG material produces charge carriers from the absorbed radiation to become electrically conductive and the resistance drops to a small value (much less than the circuit impedance). One or more radiation beams can be used to illuminate the WBG material. In some implementations, the input may be made with a multiplicity of optical inputs so that a combination of the effects of the multiple optical inputs occur simultaneously on the output. The switching time of such a WBG photonconductive switch can be short, e.g., several nanoseconds in some implementations. Such photoconductive switches can be designed and structured to handle high voltages and high currents with reduced inductance to provide rapid switching operations or modulation operations, and precise temporal control.

In some implementations, for example, the wide bandgap material can include silicon carbide (SiC) or other wide bandgap photoconductive materials. Silicon carbide (SiC) has a high dielectric breakdown strength, greater than that of most solid materials (about 4 MV/cm); high thermal conductivity (comparable to that of copper); and low optical absorption. Single crystalline Silicon Carbide materials can be used to implement a WBG photoconductive switch in circuits and devices disclosed herein. Some examples of WBG photoconductive switches are disclosed in patent filings by Lawrence Livermore National Security, LLC, including U.S. patent application Ser. No. 13/830,741, entitled "PHOTOCONDUCTIVE SWITCH WITH IMPROVED LIFE SPAN", filed on Mar. 14, 2013, PCT publication No. WO2010129804 A1, entitled "PHOTOCONDUCTIVE SWITCH PACKAGE" based on PCT application PCT/US2010/033923 filed May 6, 2010, which are incorporated by reference in their entirety as part of the disclosure of this patent document.

Figure 21:
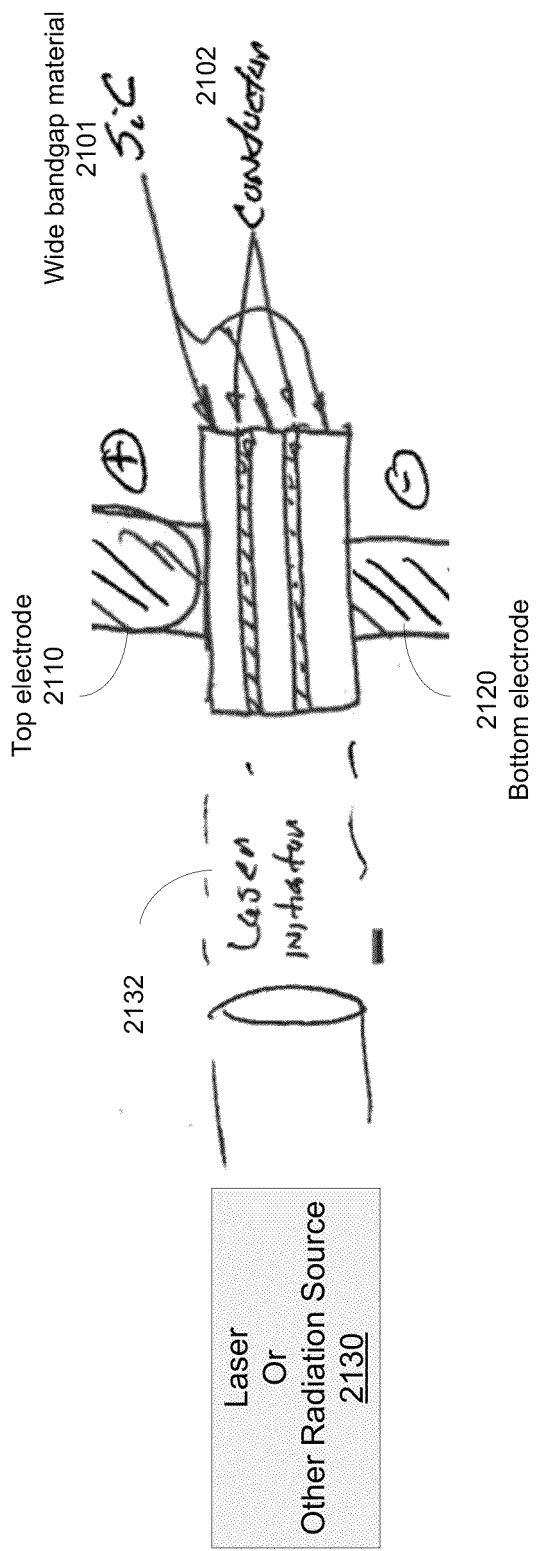

FIG. 21 shows an example of a wide bandgap electrical device 2100 having floating conductive layers between the top and bottom electrodes. The device 2100 includes a wide bandgap material 2101 such as SiC located between and in contact with upper and lower electrodes 2110 and 2120. Different from various other WBG devices, the wide bandgap material 2101 is partitioned by conductive layers 2102, similar to the partition of a dielectric medium shown in FIG. 1. The top and bottom electrodes 2110 and 2220 are coupled to an applied high voltage source and the conductive layers 2102 are floating conductors. A radiation source 2130 is provided to produce radiation 2132 for optically activating the WBG material 2101. The source 2130 can be a laser in some implementations. In operation, the radiation 2132 is absorbed to alter the conductive properties of the WBG material 2101. The radiation 2132 can be modulated to affect the functional properties of the WBG material 2101 and thereby control an amount of the current flowing between the upper and lower electrodes 2110 and 2120. The presence of one or more conductive layers 2102 increases the breakdown voltage of the WBM material 2101.

Figure 22:
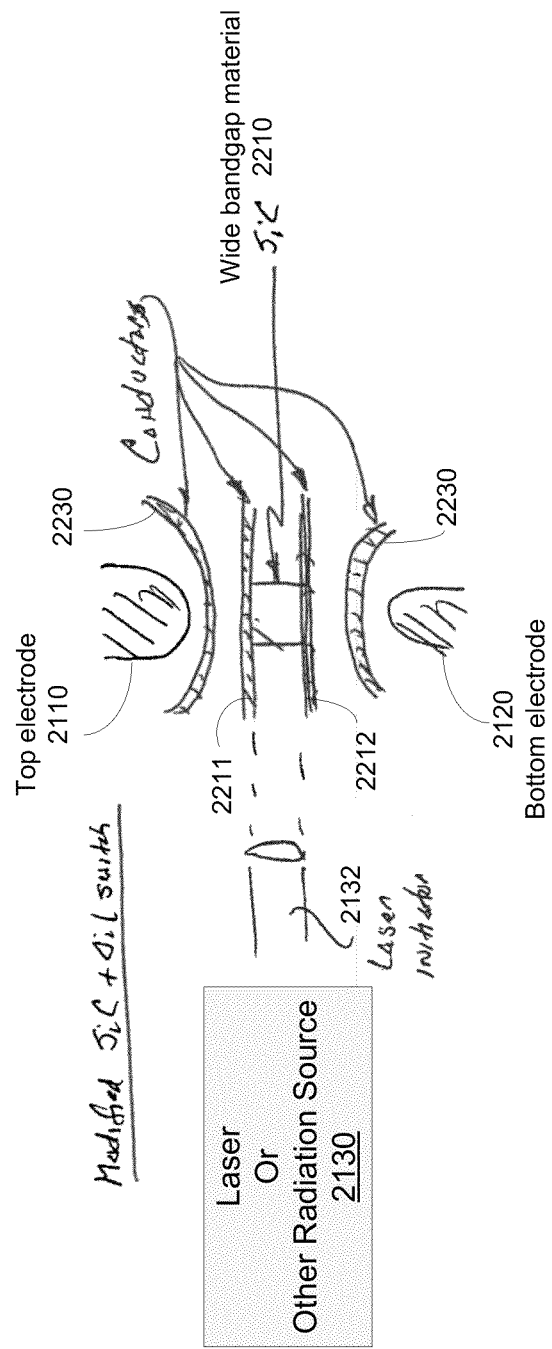
FIG. 22 shows another example of an electrical switch device based on a radiation-controlled WBG material.

FIG. 22 shows another example of an electrical switch device based on a radiation-controlled WBG material. This device includes a WGM material 2210 placed between and in contact with conductive layers or electrodes 2212 and 2211 which are floating electrodes and are placed between the top and bottom electrodes 2110 and 2120. A dielectric material such as an oil is filled in the space between the top and bottom electrodes 2110 and 2120 and the conductive layers or electrodes 2212 and 2211. A conductive layer 2230 is placed between the electrodes 2211 and 2110 and another conductive layer is placed between the electrodes 2212 and 2120. This device can use the floating conductive layers to increase the effective breakdown voltage between the top and bottom electrodes 2110 and 2120.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A high voltage switch, comprising:
   a first switch electrode;
   a second switch electrode that is spaced from the first switch electrode to provide a space between the first and second switch electrodes;
   a dielectric material that occupies at least a portion of the space between the first and second switch electrodes;
   a conductor layer located in the space between the first and second switch electrodes, wherein the conductor layer is not connected to the first switch electrode or the second switch electrode and wherein the conductor layer is electrically isolated from the first switch electrode and the second switch electrode; and
   a switch control circuit coupled to the first and second switch electrodes to supply a switch control voltage across the first and second switch electrodes to create a conductive path between the first and second switch electrodes when the switch control voltage is at or above a switch-on voltage.

2. The switch as in claim 1, further comprising:
   one or more additional conductor layers located in the space between the first and second switch electrodes.

3. The switch as in claim 2, wherein the two or more conductor layers partition the space between the first and second switch electrodes into multiple sections.

4. The switch as in claim 2, wherein each of the two or more conductor layers is a flat conductor sheet.

5. The switch as in claim 2, wherein at least one conductor layer of the two or more conductor layers is curved near an edge of the conductor layer so that the edge is bent away from an edge of an adjacent conductor layer to reduce an edge effect.

6. The switch as in claim 2, wherein each of the two or more conductor layers has a thickness less than a threshold thickness as compared to the shortest distance between the first and second switch electrodes.

7. The switch as in claim 2, wherein the total thickness of the two or more conductor layers is significantly less than the shortest distance between the first and second switch electrodes.

8. The switch as in claim 1, wherein the dielectric material includes a gas, a liquid such as oil, or a solid material.

9. The switch as in claim 1, wherein the dielectric material includes a SiC material that is responsive to laser light to change a conductive property of the SiC material; and first and second contact electrodes placed on two opposing sides of the SiC material and are spaced from the first and second switch electrodes.

10. The switch as in claim 1, further comprising:
    one or more additional dielectric materials located in the space between the first and second switch electrodes, wherein a dielectric material occupying a first section of the space between the first and second switch electrodes is different from a dielectric material occupying a second section of the space between the first and second switch electrodes.

11. The switch as in claim 1, further comprising:
    one or more additional conductor layers located in the space between the first and second switch electrodes, wherein at least one conductor layer of the two or more conductor layers includes a field-enhancement feature to ensure that a breakdown of the switch occurs at or near the location of the field-enhancement feature.

12. The switch as in claim 1, further comprising a second pair of electrodes positioned perpendicular to the first and second switch electrodes and on two opposite sides of the space between the first and second switch electrodes, wherein the second pair of electrodes is configured to generate a rapidly attenuation field in the space between the first and second switch electrodes.

13. A high voltage generator having a high breakdown voltage, comprising:
    a first electrode;
    a second electrode that is spaced from the first electrode to provide a space between the first and second electrodes;
    a dielectric material that occupies at least a portion of the space between the first and second electrodes;
    a conductor layer located in the space between the first and second electrodes, wherein the conductor layer is not connected to the first electrode or the second electrode; and
    a power supply coupled to the first and second electrodes to generate a voltage across the first and second electrodes up to the breakdown voltage of the space between the first and second electrodes.

14. The high voltage generator as in claim 13, further comprising:
    one or more additional conductor layers located in the space between the first and second electrodes.

15. The high voltage generator as in claim 14, wherein each of the two or more conductor layers is a flat conductor sheet.

16. The high voltage generator as in claim 14, wherein at least one conductor layer of the two or more conductor layers is curved near an edge of the conductor layer so that the edge is bent away from an edge of an adjacent conductor layer to reduce an edge effect.

17. The high voltage generator as in claim 14, wherein each of the two or more conductor layers has a thickness less than a threshold thickness as compared to the shortest distance between the first and second electrodes.

18. The high voltage generator as in claim 14, wherein the total thickness of the two or more conductor layers is significantly less than the shortest distance between the first and second electrodes.

19. The high voltage generator as in claim 13, wherein the dielectric material includes a SiC material that is responsive to laser light to change a conductive property of the SiC material and first and second contact electrodes placed on two opposing sides of the SiC material and are spaced from the first and second electrodes.

20. The high voltage generator as in claim 18, further comprising:
    one or more additional conductor layers located in the space between the first and second electrodes, wherein at least one conductor layer of the two or more conductor layers includes a field-enhancement feature to ensure that a breakdown of the switch occurs at or near the location of the field-enhancement feature.

* * * * *